United States Patent
Nakamaru et al.

(10) Patent No.: US 11,444,555 B2
(45) Date of Patent: Sep. 13, 2022

(54) ACTUATOR INCLUDING ELASTOMER LAYER AND ELASTIC ELECTRODES AND METHOD FOR MANUFACTURING THE SAME

(71) Applicant: Sony Corporation, Tokyo (JP)

(72) Inventors: Satoshi Nakamaru, Kanagawa (JP);
Hiroichi Ishikawa, Tokyo (JP);
Kentarou Sakai, Kanagawa (JP);
Akihiro Nakata, Kanagawa (JP);
Kazuhito Wakana, Kanagawa (JP);
Yoshio Goto, Kanagawa (JP)

(73) Assignee: Sony Corporation, Tokyo (JP)

( * ) Notice: Subject to any disclaimer, the term of this patent is extended or adjusted under 35 U.S.C. 154(b) by 390 days.

(21) Appl. No.: 16/472,458

(22) PCT Filed: Dec. 29, 2017

(86) PCT No.: PCT/JP2017/047412
§ 371 (c)(1),
(2) Date: Jun. 21, 2019

(87) PCT Pub. No.: WO2018/124308
PCT Pub. Date: Jul. 5, 2018

(65) Prior Publication Data
US 2020/0161989 A1    May 21, 2020

(30) Foreign Application Priority Data
Dec. 29, 2016    (JP) .............................. JP2016-257445

(51) Int. Cl.
*H02N 1/00*    (2006.01)
*B25J 9/10*    (2006.01)
(Continued)

(52) U.S. Cl.
CPC ............ *H02N 1/006* (2013.01); *B25J 9/1075* (2013.01); *B25J 9/12* (2013.01); *H02N 2/00* (2013.01); *H02N 2/02* (2013.01)

(58) Field of Classification Search
CPC ............ H02N 1/006; H02N 2/00; H02N 2/02; H02N 2/10; H01L 41/0471;
(Continued)

(56) References Cited

U.S. PATENT DOCUMENTS

2001/0036790 A1* 11/2001 Kornbluh .............. F04B 43/043
446/337
2003/0006669 A1    1/2003 Pei
(Continued)

FOREIGN PATENT DOCUMENTS

CN    1435899 A    8/2003
CN    1504999 A    6/2004
(Continued)

OTHER PUBLICATIONS

International Search Report and English translation thereof dated Mar. 27, 2018 in connection with International Application No. PCT/JP2017/047412.

*Primary Examiner* — Emily P Pham
(74) *Attorney, Agent, or Firm* — Wolf, Greenfield & Sacks, P.C.

(57) ABSTRACT

An actuator includes a stack including: an elastomer layer; and an elastic electrode disposed on each surface of the elastomer layer, in which the stack is subjected to a pre-strain of 50% or more at least in one direction. The stack may have a round tubular shape with the elastic electrodes disposed on opposite surfaces of the elastomer layer in a radial direction of the stack.

19 Claims, 28 Drawing Sheets

(51) Int. Cl.
*B25J 9/12* (2006.01)
*H02N 2/00* (2006.01)
*H02N 2/02* (2006.01)

(58) Field of Classification Search
CPC . H01L 41/0986; H01L 41/0933; H01L 41/27; H01L 41/0478; H01L 41/0536; H01L 41/083; H01L 41/0836; H01L 41/193; H04R 1/323; H04R 7/04; H04R 19/02; B25J 9/1075; B25J 9/12

See application file for complete search history.

(56) References Cited

U.S. PATENT DOCUMENTS

| | | | | |
|---|---|---|---|---|
| 2006/0238079 | A1* | 10/2006 | Pei | H01L 41/193 |
| | | | | 310/339 |
| 2009/0136848 | A1* | 5/2009 | Minami | H01M 10/052 |
| | | | | 429/231.95 |
| 2010/0033054 | A1* | 2/2010 | Gologanu | H01L 41/082 |
| | | | | 29/886 |
| 2011/0018400 | A1* | 1/2011 | Kato | H01L 41/193 |
| | | | | 252/62.9 R |
| 2012/0060355 | A1 | 3/2012 | Tsuchikawa et al. | |
| 2014/0145550 | A1* | 5/2014 | Hitchcock | H02N 11/002 |
| | | | | 310/300 |
| 2015/0054527 | A1* | 2/2015 | Reese | G01B 7/003 |
| | | | | 324/671 |
| 2016/0027995 | A1 | 1/2016 | Wagner et al. | |
| 2017/0006369 | A1* | 1/2017 | Kenaley | G10K 11/002 |
| 2018/0159022 | A1* | 6/2018 | Krause | H01L 41/0471 |
| 2019/0192821 | A1* | 6/2019 | Nakata | A61B 1/0057 |

FOREIGN PATENT DOCUMENTS

| | | |
|---|---|---|
| JP | 2001-238472 A | 8/2001 |
| JP | 2003-505865 A | 2/2003 |
| JP | 2005-312230 A | 11/2005 |
| JP | 2008-187881 A | 8/2008 |
| JP | 2012-065426 A | 3/2012 |
| JP | 2016-509826 A | 3/2016 |
| JP | 2016-201995 A | 12/2016 |
| WO | WO 2001/006575 A1 | 1/2001 |

* cited by examiner

ACTUATOR INCLUDING ELASTOMER LAYER AND ELASTIC ELECTRODES AND METHOD FOR MANUFACTURING THE SAME

CROSS-REFERENCE TO RELATED APPLICATIONS

This application claims the benefit under 35 U.S.C. § 371 as a U.S. National Stage Entry of International Application No. PCT/JP2017/047412, filed in the Japanese Patent Office as a Receiving Office on Dec. 29, 2017, which claims priority to Japanese Patent Application Number JP2016-257445, filed in the Japanese Patent Office on Dec. 29, 2016, each of which is hereby incorporated by reference in its entirety.

TECHNICAL FIELD

The present technique relates to an actuator and a method for manufacturing the actuator.

BACKGROUND ART

Low-voltage driving of actuators is known to need thin-film stacking techniques. Patent Literature 1 proposes a technique for depositing thin films while the elastomer is subjected to a pre-strain to control the elastomer motion direction. Patent Literature 2 proposes a technique for producing a stack by rolling a dielectric elastomer sheet having a thickness of several tens of μm formed by an applying process.

CITATION LIST

Patent Literature

Patent Literature 1: JP 2003-506858 T
Patent Literature 2: JP 2005-312230 A

DISCLOSURE OF INVENTION

Technical Problem

An object of the present technique is to provide an actuator with low driving voltage and a method for manufacturing the actuator.

Solution to Problem

A first technology to achieve the above object relates to an actuator including: a stack including: an elastomer layer; and an elastic electrode disposed on each surface of the elastomer layer, in which the stack is subjected to a pre-strain of 50% or more at least in one direction.

A second technology relates to a method for manufacturing an actuator, the method including: alternately stacking an electrode and an elastomer to form a stack; and stretching the formed stack in one direction.

Advantageous Effects of Invention

The present technique can reduce the driving voltage of actuators. It should be noted that the advantageous effects described herein are not necessarily limited, and any of the advantageous effects described in the present disclosure or any advantageous effect different from the advantageous effects may be obtained.

MODES FOR CARRYING OUT THE INVENTION

In the present technique, the stack is subjected to a pre-strain of 50% or more at least in one direction. More specifically, the stack is subjected to a pre-strain of 50% or more in one direction or two directions. In a case where the stack is subjected to a pre-strain in two directions, the pre-strain in one direction may be the same as or different from the pre-strain in the other direction. In a case where the stack is subjected to a pre-strain in two directions, one of the directions may be or may not be orthogonal to the other direction.

Examples of the shape of the stack include, but are not limited to, a flat shape, a tubular shape such as a round tubular shape, a spiral shape, a spherical shape, a curved shape, and the like. Examples of the curved shape include, but are not limited to, a partially spherical shape, a partially cylindrical shape, and the like.

Examples of the shape of the main surface of the stack include, but are not limited to, circle, ellipse, polygons (e.g., quadrilaterals, hexagon, octagon, and the like), and irregular shapes.

Embodiments of the present technique will be described in the following order.

1 First embodiment (example actuator)
2 Second embodiment (example actuator)
3 Third embodiment (example speaker)
4 Fourth embodiment (example speaker)
5 Fifth embodiment (example endoscope module)
6 Sixth embodiment (example actuator)
7 Seventh embodiment (example actuator)
8 Eighth embodiment (example tactile presentation device)
9 Ninth embodiment (example robot)

1 First Embodiment

[Structure of Actuator]

Figure 1A:
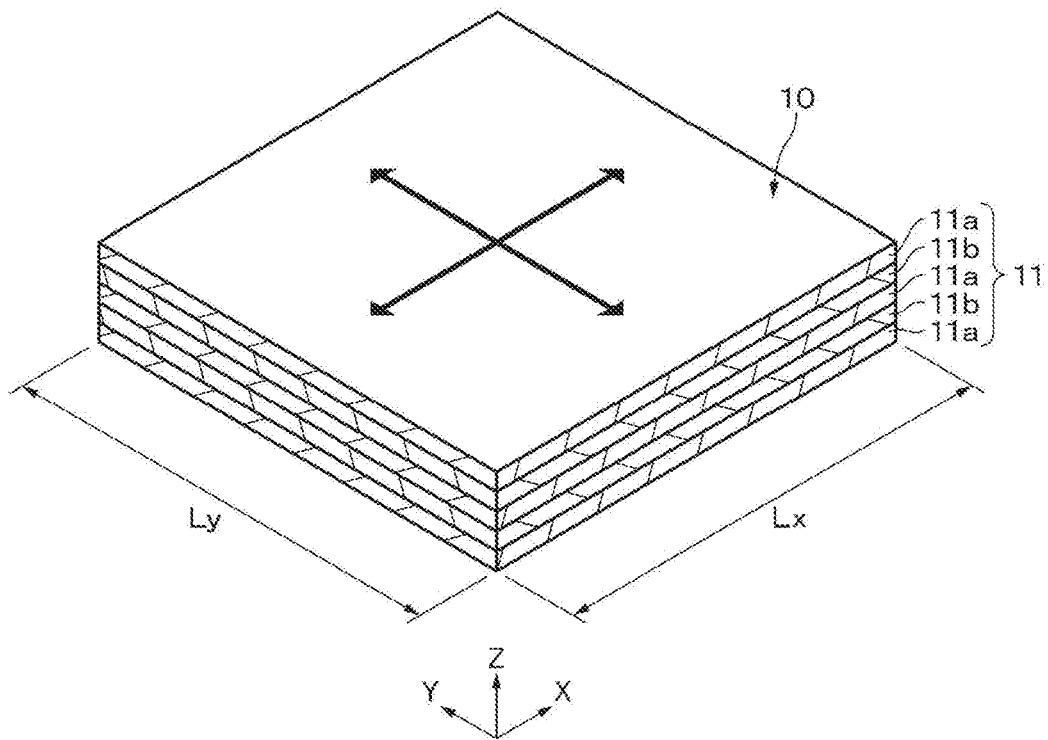
FIG. 1A is a perspective view of an example structure of an actuator according to a first embodiment of the present technique.

An actuator 10 according to a first embodiment of the present technique is a so-called dielectric elastomer actuator. As illustrated in FIG. 1A, the actuator 10 includes a stack 11, which has a rectangular sheet shape. The stack 11 includes a plurality of elastic electrodes 11a and a plurality of elastic elastomer layers (dielectric layers) 11b. The electrodes 11a and the elastomer layers 11b are alternately stacked on top of one another in the thickness direction of the stack 11. The first embodiment illustrates a case where the main surface of the stack 11 is rectangular, but the shape of the main surface of the stack 11 is not limited to this shape. In the following description, the direction parallel to one pair of two pairs of the opposite sides of the main surface of the stack 11 is referred to as an x-axis direction (first direction), and the direction parallel to the other pair as a y-axis direction (second direction).

The actuator 10 according to the first embodiment is installed in, for example, medical devices, such as artificial muscles and endoscopes, industrial devices, artificial chromatophores, antennas, electronic devices, acoustic transducers (speakers and the like), rehabilitation devices, robots, robot suits, microdevices, vibration devices (haptic presentation devices or the like), image stabilization modules, or vibrators. Examples of electronic devices include, but are not limited to, personal computers, mobile devices, mobile phones, tablet computers, displays, imaging devices, audio devices, game devices, and the like.

The actuator 10 can preferably be driven with a driving voltage of 100 V or more and 4 kV or less. As described below, the elastomer layers 11b can be thinned in the method for manufacturing the actuator according to the first embodiment because the stack 11 is stretched in the x-axis direction and the y-axis direction after formed. Therefore, the actuator 10 can be driven with the low voltage as described above.

Figure 1B:
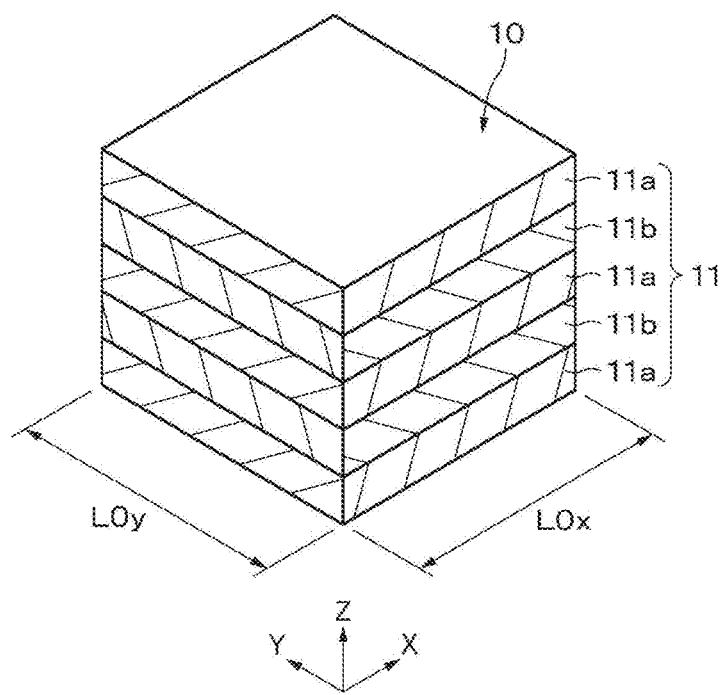
FIG. 1B is a perspective view of the actuator of FIG. 1A in the pre-strain-released state.

The stack 11 is subjected to a pre-strain of 50% or more in each of the x-axis direction and the y-axis direction (see FIG. 1A and FIG. 1B). The pre-strain in the x-axis direction may be the same as or different from the pre-strain in the y-axis direction. The pre-strain in each of the x- and y-axis directions is preferably 80% or more, more preferably 100% or more, and still more preferably 120% or more. The upper limit of the pre-strain in each of the x- and y-axis directions is preferably 1000% or less, and more preferably 500% or less.

The pre-strain is obtained from the following formulas.

Pre-strain [%] in x-axis direction=$((Lx-L0x)/L0x) \times 100$

Pre-strain [%] in y-axis direction=$((Ly-L0y)/L0y) \times 100$

In the formulas, Lx, L0x, Ly, and L0y denote the values of the following physical properties.

Lx: the length of the sides of the stack 11 in the x-axis direction in the pre-strained state (see FIG. 1A)

L0x: the length of the sides of the stack 11 in the x-axis direction in the pre-strain-released state (see FIG. 1B)

Ly: the length of the sides of the stack 11 in the y-axis direction in the pre-strained state (see FIG. 1A)

L0y: the length of the sides of the stack 11 in the y-axis direction in the pre-strain-released state (see FIG. 1B)

It is noted that Lx, L0x, Ly, and L0y are all values measured at room temperature (23° C.).

(Elastomer Layer)

The elastomer layers 11b are elastic sheets. To lower the driving voltage, the mean thickness of the elastomer layers 11b in the pre-strained state is preferably 10 µm or less, more preferably 5 µm or less, and still more preferably 3 µm or less. It is noted that, in a known method for forming elastomer layers by only applying and drying processes, it is difficult to form elastomer layers with a mean thickness of 10 µm or less. The lower limit of the mean thickness of the elastomer layers 11b in the pre-strained state is not limited but, for example, 300 nm or more.

To lower the driving voltage, the mean thickness of the elastomer layers 11b in the pre-strain-released state is preferably 40 µm or less, more preferably 20 µm or less, and still more preferably 12 µm or less. The lower limit of the mean thickness of the elastomer layers 11b in the pre-strain-released state is not limited but, for example, 1 µm or more.

The mean thickness of the elastomer layers 11b is obtained as described below. First, the stack 11 is processed by using a focused ion beam (FIB) method or the like to create a cross section, and the cross-sectional image (hereinafter referred to as a "cross-sectional SEM image") is captured with a scanning electron microscope (SEM). Next, the thickness of one of the elastomer layers 11b in the cross-sectional SEM image is measured at each of randomly selected ten points, and the measurements are simply averaged to obtain the mean thickness (arithmetic mean) of the elastomer layer 11b.

The Young's modulus of the elastomer layers 11b is preferably 10 MPa or less, more preferably 0.05 MPa or more and 10 MPa or less, and still more preferably 0.1 MPa or more and 1 MPa or less. The Young's modulus is a value determined in accordance with JIS K 6251:2010. A Young's modulus of 10 MPa or less makes it easy to stretch the elastomer layers 11b. In addition, a Young's modulus of 0.05 MPa or more makes it easy to handle the elastomer layers 11b. The strain at break of the elastomer layers 11b is preferably 200% or more, and more preferably 200% or more and 1200% or less. A strain at break of 200% or more enables a large amount of stretching. The strain at break is measured in accordance with, for example, JIS K 6251:2010.

The elastomer layers 11b contain, for example, an insulating elastomer as an insulating elastic material. The elastomer layers 11b may contain an additive as needed. The additive is, for example, at least one of a cross-linker, a plasticizer, an anti-aging agent, a surfactant, a viscosity modifier, a reinforcing agent, a colorant, or the like. The insulating elastomer contains at least one of acrylic rubber, silicone rubber, ethylene-propylene-diene terpolymer (EPDM), natural rubber (NR), butyl rubber (IIR), isoprene rubber (IR), acrylonitrile-butadiene copolymer rubber (NBR), hydrogenated acrylonitrile-butadiene copolymer rubber (H-NBR), hydrin-based rubber, chloroprene rubber (CR), fluorocarbon rubber, urethane rubber, or the like. To express good conductivity, the insulating elastomer is preferably free of an additive such as titanium oxide or silicon oxide.

(Electrode)

The electrodes 11a have elasticity. The electrodes 11a having elasticity can be deformed in conformity with deformation of the elastomer layers 11b when the actuator 10 is driven. Furthermore, as described below, the electrodes 11a can be deformed in conformity with deformation of the elastomer layers 11b when the stack 11 is stretched.

The electrodes 11a are, for example, solid, gel, or liquid. The electrode 11a may be formed of a thin film, or a conductive material carried on the surface of the elastomer layer 11b without a binder. The electrode 11a may be disposed on the entire surface or substantially the entire surface of the elastomer layer 11b, or may be disposed on part of the surface of the elastomer layer 11b so as to form a predetermined pattern. FIG. 1A illustrates the latter example. Examples of the predetermined pattern include, but are not limited to, stripe, lattice, spiral, concentric, mesh, geometric patterns, and the like.

The mean thickness of the electrodes 11a in the pre-strain-released state is preferably 50 µm or less, more preferably 5 µm or less, and still more preferably 3 µm or less. The lower limit of the mean thickness of the electrodes 11a in the pre-strain-released state is not limited but, for example, 300 nm or more. The mean thickness of the electrodes 11a is obtained in the same manner as that for the mean thickness of the elastomer layers 11b.

The Young's modulus of the electrodes 11a is preferably 10 MPa or less, more preferably 0.05 MPa or more and 10 MPa or less, and still more preferably 0.1 MPa or more and 1 MPa or less. The Young's modulus is a value determined in accordance with JIS K 6251:2010. A Young's modulus of 10 MPa or less makes it easy to stretch the electrodes 11a. In addition, a Young's modulus of 0.05 MPa or more makes it easy to handle the electrodes 11a. The strain at break of the electrodes 11a is preferably 200% or more, and more preferably 200% or more and 1200% or less. A strain at break of 200% or more enables a large amount of stretching. The strain at break is measured in accordance with, for example, JIS K 6251:2010.

The volume resistivity of the electrodes 11a with the stack 11 subjected to a strain of 100% or more is preferably 10 MΩ·cm or less. Accordingly, even in a case where the stack 11 is subjected to a strain of 100% or more, the electrodes 11a can function as electrodes having good conductivity. The upper limit of the strain is not limited, but preferably 1000% or less, and more preferably 500% or less. The volume resistivity of the electrodes IIa is a value obtained by the four-terminal method in accordance with JIS K 7194-1994. In the cross-cut test in accordance with JIS K 5600-5-6:1999, the adhesion between the electrode 11a and the elastomer layer 11b is preferably rated as any one of scales 0 to 2. In a case where the adhesion is rated as any one of scales 0 to 2, peeling between the elastomer layer 11b and the electrode 11a due to the difference in rigidity between the elastomer layer 11b and the electrode 11a is unlikely to occur after the stack 11 is greatly stretched so as to be subjected to a pre-strain of 50% or more.

The electrodes 11a contain a conductive material. The electrodes 11a may further contain, as needed, at least one of an elastic binder, a gel, a suspension, or an oil. In addition, the electrodes 11a may further contain an additive as needed.

The conductive material is, for example, at least one of a conductive filler or a conductive polymer. Examples of the shape of the conductive filler include, but are not limited to, sphere, ellipse, needle, plate, scale, tube, wire, bar (rod), fiber, irregular shapes, and the like. It is noted that a conductive filler with one shape may be used alone or conductive fillers with two or more shapes may be used in combination.

The conductive filler contains, for example, at least one of a carbon-based filler, a metal-based filler, a metal oxide-based filler, or a metal-coated filler. Here, metals include semimetals.

The carbon-based filler contains, for example, at least one of carbon black (e.g., Ketjenblack, acetylene black, or the like), porous carbon, carbon fiber (e.g., PAN-based carbon fiber, pitch-based carbon fiber, or the like), carbon nanofiber, fullerene, graphene, vapor-grown carbon fiber (VGCF), carbon nanotube (e.g., SWCNT, MWCNT, and the like), carbon microcoil, or carbon nanohorn.

The metal-based filler contains, for example, at least one of copper, silver, gold, platinum, palladium, nickel, tin, cobalt, rhodium, iridium, iron, ruthenium, osmium, manganese, molybdenum, tungsten, niobium, tantalum, titanium, bismuth, antimony, or lead.

The metal oxide-based filler contains, for example, indium tin oxide (ITO), zinc oxide, indium oxide, antimony-doped tin oxide, fluorine-doped tin oxide, aluminum-doped zinc oxide, gallium-doped zinc oxide, silicon-doped zinc oxide, zinc oxide-tin oxide, indium oxide-tin oxide, or zinc oxide-indium oxide-magnesium oxide.

The metal-coated filler is a filler including a base filler coated with a metal. Examples of the based filler include mica, glass beads, glass fiber, carbon fiber, calcium carbonate, zinc oxide, and titanium oxide. The metal that covers the base filler contains, for example, at least one of Ni or Al.

The mean size of the conductive filler is preferably 35 nm or more and 37 nm or less. This is because the electrodes 11a having excellent conductivity are obtained. Here, the mean size is obtained in the following manner. First, a scanning electron microscope (SEM) is used to capture a SEM image of the conductive filler. Subsequently, the size of each of 10 pieces of the conductive filler, which are randomly selected in the SEM image, is measured by using image analysis software. Here, the size of the conductive filler means the so-called maximum Feret diameter and, specifically, means the maximum distance between two parallel lines that are drawn at given angles and tangential to the contour of the conductive filler.

The conductive polymer is, for example, at least one of polyethylene dioxythiophene/polystyrene sulfonate (PEDOT/PSS), polyaniline, polyacetylene, or polypyrrole.

The binder is preferably an elastomer. Examples of the elastomer include the same elastomers as those in the elastomer layers 11b. Examples of the additive include the same additives as those in the elastomer layers.

The electrodes 11a may contain a composite material (complex material). The composite material contains, for example, at least one of a composite material containing an elastomer and at least one of a conductive polymer or a conductive filler, a composite material containing an elastic ion-conductive material and an electrolyte, a composite material containing a polymer suspension (acrylic emulsion or the like) and at least one of a conductive polymer or a conductive filler, a composite material containing a block copolymer and at least one of a conductive polymer or a conductive filler, or a composite material containing a polymer gel and an ion conductor.

(Improvement of Adhesion)

The interface between the elastomer layer 11b and the electrode 11a preferably undergoes an adhesion improving treatment. With improved adhesion, peeling between the elastomer layer 11b and the electrode 11a due to the difference in rigidity between the elastomer layer 11b and the electrode 11a is unlikely to occur after the stack 11 is greatly stretched so as to be subjected to a pre-strain of 50% or more.

To improve the adhesion of the interface, the stack 11 preferably includes at least one of (1) a silane coupling agent disposed between the elastomer layer 11b and the electrode 11a, (2) a primer layer disposed between the elastomer layer 11b and the electrode 11a, (3) the physically pretreated surface of at least one of the elastomer layer 11b or the electrode 11a, or (4) the fine uneven surface of at least one of the elastomer layer 11b or the electrode 11a. It is noted that the physical pretreatment is, for example, at least one of excimer light irradiation treatment, ultraviolet irradiation treatment, plasma treatment, or corona treatment.

(Silane Coupling Agent)

Types of the silane coupling agent are not specifically limited, allowing any of known silane coupling agents to be used. Specific examples of the silane coupling agent include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryl trimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3- acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, hydrochloride of N-(vinylbenzyl)-2-aminoethyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl) tetrasulfide, and 3-isocyanotopropyltriethoxysilane.

[Operation of Actuator]

Next, an example operation of the actuator 10 according to the first embodiment of the present technique will be described.

When a driving voltage is applied across the electrodes 11a and 11a facing each other with the elastomer layer 11b therebetween, an attractive force due to the Coulomb force is generated between the electrodes 11a and 11a. Thus, the elastomer layer 11b disposed between the electrodes 11a and 11a is pressed in the thickness direction so as to be thinned and elongated.

On the other hand, when the driving voltage applied across the electrodes 11a and 11a facing each other with the elastomer layer 11b therebetween is released, an attractive force due to the Coulomb force is not generated between the electrodes 11a and 11a. Thus, the elastomer layer 11b returns to its original thickness and contracts to its original size because of the resilience of the elastomer layer 11b.

[Method for Manufacturing Actuator]

Next, an example method for manufacturing the actuator 10 according to the first embodiment of the present technique will be described.

(Step of Preparing Conductive Coating Material)

A conductive coating material, which is a coating material for electrode formation, is prepared by dispersing a conductive material in a solvent. As needed, at least one of binders or additives may be further added to the solvent. For example, additives such as a surfactant, a viscosity modifier, and a dispersant, may be added as needed in order to improve the coatability of the conductive coating material on the elastomer layer 11b and the pot life. The conductive coating material may be a conductive ink or may be a conductive paste. The dispersion method preferably involves, for example, stirring, ultrasonic dispersion, bead dispersion, kneading, or homogenizer treatment.

The solvent may be either a polar solvent or a non-polar solvent, but preferably a non-polar solvent. The solvent is any solvent that can disperse the conductive material. Examples of the solvent include water, toluene, ethyl acetate, ethanol, methyl ethyl ketone, isopropanol alcohol, acetone, anones (cyclohexanone, cyclopentanone), hydrocarbon (hexane), amide (DMF), sulfide (DMSO), butyl cellosolve, butyl triglycol, propylene glycol monomethyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, methyl glycol, terpineol, and butyl carbitol acetate. Specifically, the conductive coating material preferably contains a carbon-based filler, silicone, and a non-polar solvent.

(Step of Preparing Coating Material for Elastomer-Layer Formation)

A coating material for elastomer-layer formation is prepared by dispersing an elastomer in a solvent. As needed, at least one of additives or resin materials other than elastomers may be further added to the solvent. For example, additives such as a surfactant, a viscosity modifier, and a dispersant may be added as needed in order to improve the coatability of the coating material for elastomer-layer formation on the electrode 11a and the pot life. Examples of the dispersion process include the same processes as those described in the step of preparing the conductive coating material. The solvent is any solvent that can disperse the elastomer. Examples of the solvent include the same solvents as those described in the step of preparing the conductive coating material.

(Step of Producing Stack)

The stack 11 is produced in the following manner. First, a substrate is provided, and the surface of the substrate undergoes a peel treatment as needed. The substrate may be either an inorganic substrate or a plastic substrate. The substrate has, for example, a plate shape or a sheet shape.

Next, a conductive coating material is applied to one surface of the substrate to form a coating film. Here, applying includes printing. Examples of the applying method include, but are not limited to, microgravure coating method, wire-bar coating method, direct gravure coating method, die coating method, dipping method, spray coating method, reverse roll coating method, curtain coating method, comma coating method, knife coating method, spin coating method, ink jet printing method, relief printing method, offset printing method, gravure printing method, intaglio printing method, rubber plate printing method, screen printing method, and flexographic printing method.

Subsequently, the coating film formed on one surface of the substrate is dried. The drying conditions are not limited and may be either natural drying or heat drying. The electrode 11a is accordingly formed on one surface of the substrate. Next, one surface of the electrode 11a may undergo the adhesion improving treatment as needed.

Next, a coating material for elastomer-layer formation is applied to one surface of the electrode 11a to form a coating film. Examples of the applying method include the same applying methods as those for the conductive coating material. Subsequently, the coating film formed on one surface of the substrate is dried. The drying conditions are not limited and may be either natural drying or heat drying. Accordingly, the elastomer layer 11b is formed on one surface of the electrode 11a. Next, one surface of the elastomer layer 11b may undergo the adhesion improving treatment as needed.

Thereafter, the step of forming the electrode 11a and the step of placing the elastomer layer 11b are alternately repeated to form a layered product on one surface of the substrate. The layered product is then entirely peeled from the substrate, or the layered product is partially peeled from the substrate. The stack 11 is obtained accordingly.

(Stretching Step)

Subsequently, the obtained stack 11 is stretched (biaxially stretched) in the x- and y-axis directions. The stack is thus subjected to a pre-strain of 50% or more in the x- and y-axis directions. In this stretched state, the periphery of the stack 11 may be holed by a holder. The intended actuator 10 is obtained accordingly.

[Advantageous Effects]

The actuator 10 according to the first embodiment includes the stack 11 including a plurality of the elastic elastomer layers 11b and a plurality of the elastic electrodes 11a. The elastic elastomer layers 11b and the elastic electrodes 11a are alternately stacked on top of one another. The stack 11 is subjected to a pre-strain of 50% or more in the x- and y-axis directions. The elastomer layer 11b can be thus thinned to lower the driving voltage.

In addition, since the electrodes 11a in the actuator 10 according to the first embodiment are capable of functioning as electrodes even when greatly elongated, the stack 11 can be greatly stretched after formed and subjected to a pre-strain of 50% or more in the x- and y-axis directions. On the other hand, in a typical actuator, the conformability of the electrodes is as low as about several tens of percent with respect to the initial length, and the electrodes may thus lose their function as electrodes when greatly elongated. It is thus difficult to greatly stretch the stack and subject the stack to a pre-strain of 50% or more in the x- and y-axis directions.

In addition, in the method for manufacturing the actuator according to the first embodiment, the electrodes 11a and the elastomer layers 11b are repeatedly stacked on top of one another by an applying process to form the stack 11, and the stack is stretched to provide the stack 11. This method makes it possible to form the stack 11 including the elastomer layers 11b and the electrodes 11a each having a film thickness that is difficult to obtain by a typical applying process.

In addition, since elastomer layers are handled in the form of single layer in a typical method for manufacturing an actuator, the handling ability of the elastomer layers may be poor, or the actuator may be manufactured at low efficiency. On the other hand, in the method for manufacturing the actuator according to the first embodiment, the elastomer layers 11b are handled in the form of the stack 11 instead of single layer, and thus the handling ability of the elastomer layers 11b can be improved, and the actuator 10 can be manufactured at high efficiency. In addition, in a case where the elastomer layers 11b, which are difficult to handle in the form of single layer, are stacked, it is easy to handle the elastomer layers 11b, for example, cut out or superimpose the elastomer layers 11b. Also, the influence of unevenness of the surface can be reduced.

[Modifications]

(Modification 1)

Figure 2:
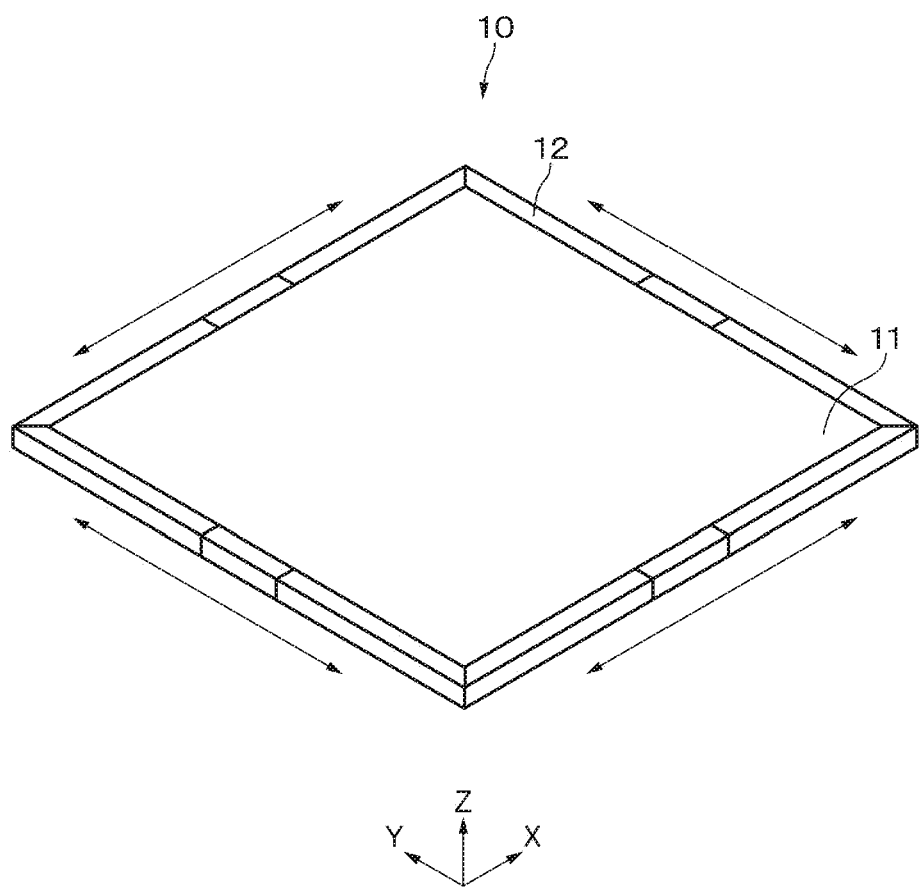
FIG. 2 is a perspective view of an example structure of an actuator according a modification of the first embodiment of the present technique.

As illustrated in FIG. 2, the actuator 10 may further include a holding unit 12, which holds the stack 11 in the pre-strained state. The holding unit 12 holds the entire periphery of the stack 11. The holding unit 12 is stretchable in the x- and y-axis directions as indicated by the arrows in FIG. 2. In other words, the holding unit 12 is capable of changing the stack 11 in size. The pre-strain on the stack 11 can be adjusted by changing the stack 11 in size.

It is noted that the holding unit 12 has any structure as long as the holding unit 12 can hold the stack 11 subjected to a pre-strain in the x- and y-axis directions. For example, the holding unit 12 may partially hold the periphery of the stack 11 at discontinuous positions. In addition, the holding unit 12 may be disposed in advance on a housing, flame, or the like of an electronic device. Alternatively, the stack 11 may be held in the pre-strained state by attaching the periphery or the like of the stack 11 to a housing, frame, or the like of an electronic device.

(Modification 2)

The sheet-like elastomer layer 11b may be placed on one surface of the electrode 11a instead of applying and drying a coating material for elastomer-layer formation on one surface of the electrode 11a to form the elastomer layer 11b. Here, before the elastomer layer 11b is placed, at least one of the surface of the electrode 11a on which the elastomer layer 11b is to be placed or the surface of the elastomer layer 11b to be placed on the electrode 11a may undergo the adhesion improving treatment.

(Modification 3)

The elastomer layer 11b may have a multilayer structure. In this case, the layer forming the surface in contact with the electrode 11a may be made of a material having high adhesion to the electrode 11a.

(Modification 4)

The stretching and strain properties of the elastomer layer 11b may be such that the Young's modulus of the elastomer layer 11b after stretching is preferably 0.05 MPa or more and 10 MPa or less, and more preferably 0.1 MPa or more and 1 MPa or less, and the Young's modulus after further stretching from the stretched state rapidly increases to 0.3 MPa or more or about 5 MPa.

(Modification 5)

At least part of the electrode 11a may be made of a hard material having a Young's modulus exceeding 10 MPa. For example, the electrode 11a may have a flexible portion having elasticity and a hard portion having lower elasticity than the flexible portion. The hard portion is preferably located at an easily breakable part of the drive section. The hard portion is made of, for example, metal or the like.

(Modification 6)

The electrode 11a may have elastic anisotropy. Specifically, the electrode may have different elasticity in the first direction and the second direction. For example, the electrode may have elasticity in the first direction, but may have almost no elasticity in the second direction.

The first embodiment illustrates an example where the entire stack 11 is subjected to a pre-strain, but part of the stack 11 may be subjected to a pre-strain. In this case, the pre-strain is obtained from the following formulas.

Pre-strain [%] in x-axis direction=$((Mx-M0x)/M0x) \times 100$

Pre-strain [%] in y-axis direction=$((My-M0y)/M0y) \times 100$

In the formulas, $Mx$, $M0x$, $My$, and $M0y$ denote the values of the following physical properties.

$Mx$: the length of the pre-strain part in the x-axis direction in the pre-strained state $M0x$: the length of the sides of the pre-strain part in the x-axis direction in the pre-strain-released state $My$: the length of the sides of the pre-strain part in the y-axis direction in the pre-strained state $M0y$: the length of the sides of the pre-strain part in the y-axis direction in the pre-strain-released state It is noted that $Mx$, $M0x$, $My$, and $M0y$ are all values measured at room temperature (23° C.).

2 Second Embodiment

[Structure of Actuator]

Figure 3:
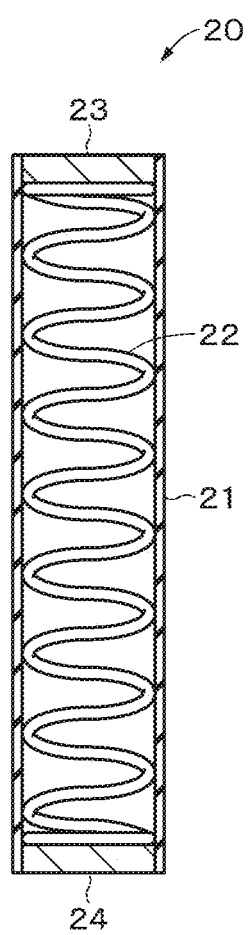
FIG. 3 is a cross-sectional view of an example structure of an actuator according to a second embodiment of the present technique.

As illustrated in FIG. 3, an actuator 20 according to a second embodiment of the present technique includes a round tubular, sheet-like stack 21, a round tubular coil spring 22, which supports the inner circumferential surface of the stack 21, and sealing members 23 and 24, which close the openings at the opposite ends of the stack 21. The actuator 20 may further include a round tubular protective layer (not illustrated) that covers the outer circumferential surface of the stack 21. The stack 21 may be formed in a round tubular shape in advance, or may be wound around the coil spring 22 to form a round tubular shape.

The actuator 20 is installed in, for example, medical devices such as endoscopes, industrial devices, electronic devices, artificial muscles, robots, robot suits, and the like. The actuator 20 may be continuously usable or may be disposable. In a case where the actuator 20 is used in medical devices, such as endoscopes, the actuator 20 is preferably disposable from a hygienic point of view.

The actuator 20 has a sealed cylindrical internal space and has the coil spring 22 in the internal space. The internal space is filled with gas serving as fluid. The gas is, for example, at least one of air, noble gas, carbon dioxide, or the like.

The stack 21, the coil spring 22, the sealing members 23 and 24, and the protective layer in the actuator 20 will be sequentially described below.

(Stack)

Figure 4A:
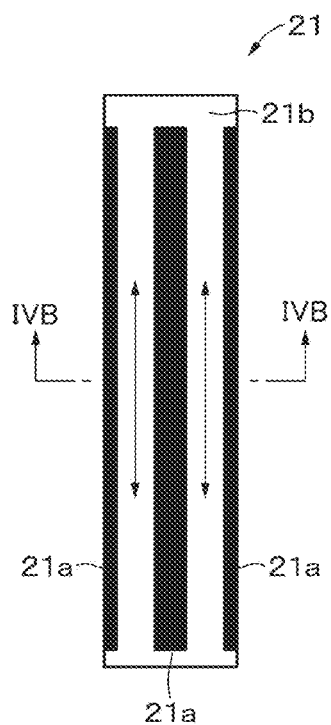
FIG. 4A is a side view of an example structure of a stack.
Figure 4B:
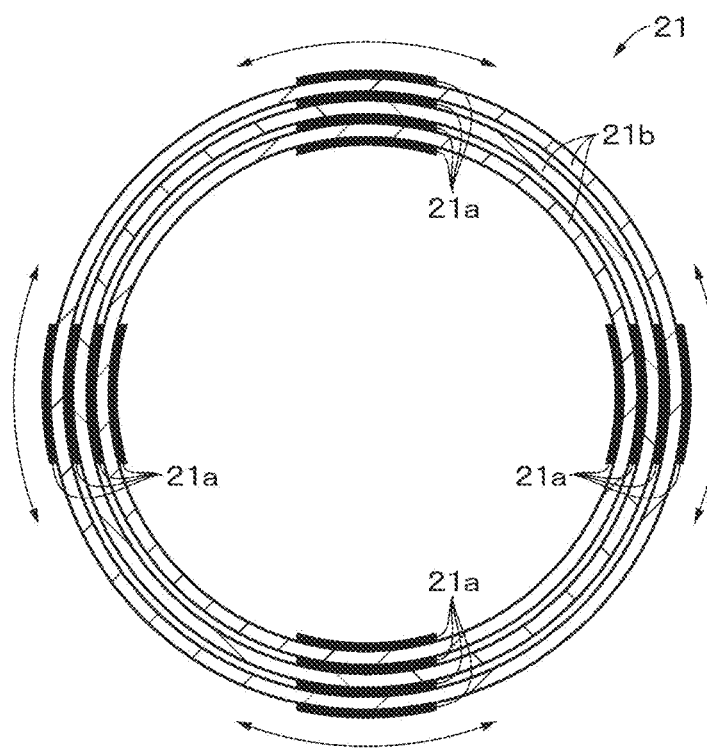
FIG. 4B is a cross-sectional view taken along line IVB-IVB in FIG. 4A.

As indicated by the arrows in FIG. 4A and FIG. 4B, the stack 21 is subjected to a pre-strain of 50% or more in each of the height direction and the circumferential direction of the stack 21. When the opposite ends of the stack 21 are held by the opposite ends of the sealing members 23 and 24 or the coil spring 22, the stack 21 is held in the pre-strained state. The pre-strain in the height direction may be the same as or different from the pre-strain in the circumferential direction. The pre-strain in the height direction and the circumferential direction is preferably 80% or more, more preferably 100% or more, and still more preferably 120% or more. The upper limit of the pre-strain in the height direction and the circumferential direction is preferably 400% or less, and more preferably 300% or less.

The pre-strain is obtained from the following formulas.

Pre-strain [%] in height direction=$((H-H0)/H0) \times 100$

Pre-strain [%] in circumferential direction=$((C-C0)/C0) \times 100$

H: the height of the round tubular stack 21 in the pre-strained state

H0: the height of the round tubular stack 21 in the pre-strain-released state

C: the length of the outer circumference of the round tubular stack 21 in the pre-strained state C0: the length of the outer circumference of the round tubular stack 21 in the pre-strain-released state It is noted that H, H0, C, and C0 are all values measured at room temperature (23° C.).

As illustrated in FIG. 4A and FIG. 4B, the stack 21 includes a plurality of elastic electrodes 21a and a plurality of elastic elastomer layers 21b. The electrodes 21a and the elastomer layers 21b are alternately stacked on top of one another in the radial direction of the stack 21.

(Elastomer Layer)

The elastomer layers 21b are round tubular sheets. The elastomer layers 21b are stacked on top of one another concentrically about the coil spring 22. Alternatively, the elastomer layers 21b having a strip shape may be spirally wound around the circumferential surface of the coil spring 22. The elastomer layers 21b may be formed in a round tubular shape in advance, or may be wound around the coil spring 22 to form a round tubular shape. Except for these points, the elastomer layers 21b are the same as the elastomer layers 11b in the first embodiment.

(Electrode)

The electrodes 21a extend in the height direction of the stack 21 and are spaced from each other at regular intervals in the circumferential direction. In addition, the electrodes 21a overlap one another in the radial direction of the stack 21. In other words, the electrodes 21a on both sides of the elastomer layer 11b face each other with the elastomer layer 11b therebetween. Except for these points, the electrodes 21a are the same as the electrodes 11a in the first embodiment.

(Coil Spring)

The coil spring 22 is an example support that can be bent in any direction and can be elastically deformed. The coil spring 22 is a coil spring formed by winding a linear member, such as a metal wire, into a round tubular, spiral shape. A space is formed between turns of the linear member. Therefore, the coil spring 22 discretely supports the inner circumferential surface of the stack 21 in the height direction of the stack 21. Supporting the inner circumferential surface of the stack 21 in this manner facilitates deformation of the stack 21 and facilitates expansion/contraction and bending of the actuator 20. Here, the "discretely supporting the inner circumferential surface of the stack 21 in the height direction of the stack 21" means supporting the inner circumferential surface of the stack 21 at discontinuous positions in the height direction of the stack 21. Here, the intervals between discontinuous positions may be regular or irregular.

(Sealing Member)

The sealing members 23 and 24 have a disk shape. The sealing members 23 and 24 contain a metal or a polymer resin. The sealing members 23 and 24 may contain an elastomer or the like and may be elastically deformable. The sealing members 23 and 24 may be a device (e.g., an electronic device, such as a camera) provided at an end portion of the actuator 20, or may be an operation section of the actuator 20.

(Protective Layer)

The protective layer is intended to protect the electrode 11a and is an elastic sheet. The protective layer contains an insulating polymer resin. Examples of the polymer resin include vinyl chloride.

[Operation of Actuator]

Next, an example operation of the actuator 20 according to the second embodiment of the present technique will be described.

When a driving voltage is applied across one pair of the electrodes 21a and 21a among a plurality of pairs of the electrodes 21a and 21a facing each other with the elastomer layer 21b therebetween, the elastomer layer 11b disposed between the pair of the electrodes 21a and 21a elongates, so that the actuator 20 bends. When the driving voltage applied to the one pair of the electrodes 21a and 21a is released, the actuator 20 returns to its original cylindrical shape.

[Method for Manufacturing Actuator]

Next, an example method for manufacturing the actuator according to the second embodiment of the present technique will be described.

First, the conductive coating material and the coating material for elastomer-layer formation are alternately applied and dried on the cylindrical surface of a round tubular substrate. Thereafter, the stack is entirely peeled from the substrate, or the stack is partially peeled from the substrate to obtain the stack 21.

Next, the stack 21 is stretched (biaxially stretched) in the height direction and the circumferential direction of the stack 21. The stack 21 is thus subjected to a pre-strain of 50% or more in the height direction and the circumferential direction. The coil spring 22 is inserted into the inner side of the pre-strained stack 21. Alternatively, the coil spring 22 may be inserted into the inner side of the stack 21 while the stack 21 is stretched in the height direction and the circumferential direction. Next, the sealing members 23 and 24 are fitted to the respective openings at the opposite ends of the stack 21 to close the openings at the opposite ends of the stack 21. Next, the opposite ends of the stack 21 are held by the sealing members 23 and 24 or the opposite ends of the coil spring 22. The actuator 20 illustrated in FIG. 3 is obtained accordingly.

[Advantageous Effects]

The actuator 20 according to the second embodiment and the method for manufacturing the actuator 20 offer the same advantageous effects as those offered by the actuator 10 according to the first embodiment and the method for manufacturing the actuator 10.

[Modifications]

(Modification 1)

The first embodiment illustrates a case where the electrodes 21a are disposed on part of the circumferential surface of the elastomer layer 21b so as to form a predetermined pattern. However, the electrode 21a may be formed in the entire circumferential surface of the elastomer layer 21b.

(Modification 2)

The actuator 20 may be manufactured in the following manner. First, a strip-shaped stack 21 is obtained in the same manner as in the first embodiment except that the conductive coating material is applied in the form of stripes. It is noted that, in the case of using a sheet as a substrate, the stack 21 may be produced by the roll-to-roll process. Next, the stack 21 is wound around the circumferential surface of the coil spring 22 while the stack 21 is stretched in the height direction and the circumferential direction. The subsequent steps are the same as those in the second embodiment.

(Modification 3)

The pre-strain in the circumferential direction of the stack 21 may be larger than the pre-strain in the height direction of the stack 21. In this case, the resistance of the stack 21 to dielectric breakdown can be improved while the displacement in the height direction of the stack 21 is maintained satisfactory.

(Modification 4)

The stack 21 may be subjected to a pre-strain in the circumferential direction and no pre-strain in the height direction. In this case, the resistance of the stack 21 to dielectric breakdown can also be improved while the displacement in the height direction of the stack 21 is maintained satisfactory.

3 Third Embodiment

[Structure of Speaker]

Figure 5:
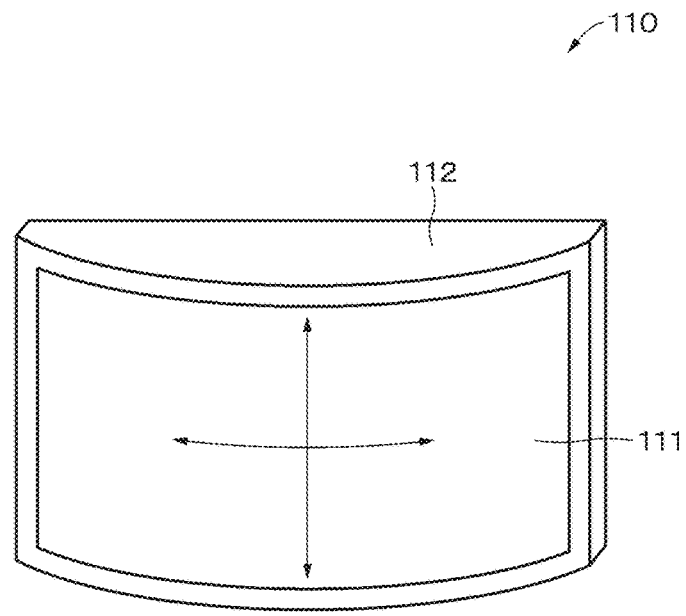
FIG. 5 is a perspective view of an example structure of a speaker according to a third embodiment of the present technique.

As illustrated in FIG. 5, a speaker 110 according to a third embodiment of the present technique includes a rectangular actuator 111, and a holding unit 112, which holds the peripheral portion of the actuator 111. The actuator 111 is the same as the actuator 10 according to the first embodiment.

The holding unit 112 holds the actuator 111 in such a manner that the actuator 111 (i.e., stack) is curved in an arch shape and subjected to a pre-strain of 50% or more in each of the curving direction and the width direction of the actuator 111 (the directions denoted by the arrow in FIG. 5).

[Advantageous Effects]

In the speaker 110 according to the third embodiment, the actuator 111 (i.e., stack) is subjected to a pre-strain of 50% or more in each of the curving direction and the width direction. This configuration can lower the driving voltage of the speaker 110.

4 Fourth Embodiment

[Structure of Speaker]

Figure 6:
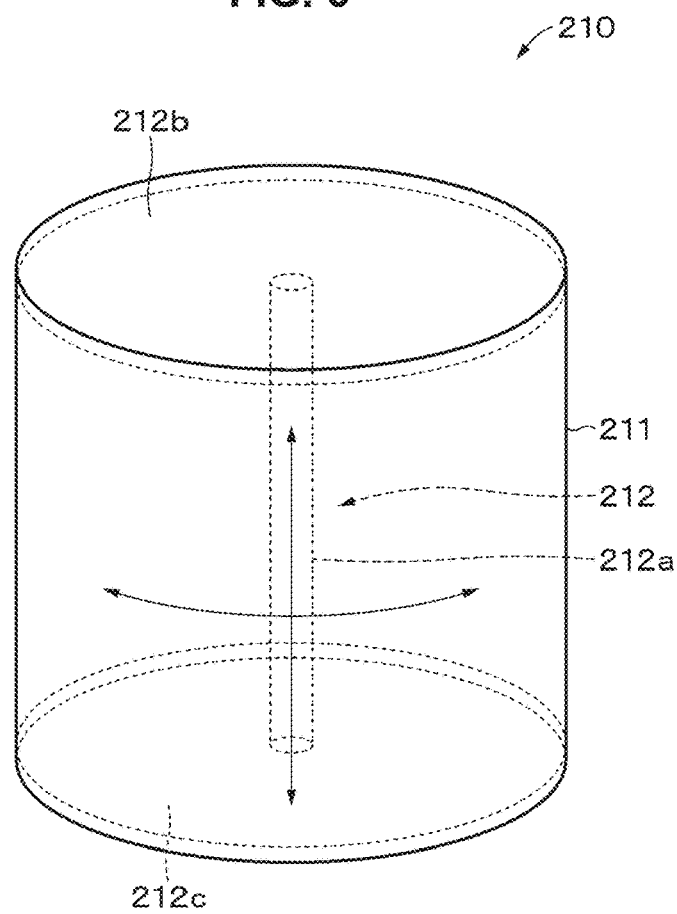
FIG. 6 is a perspective view of an example structure of a speaker according to a fourth embodiment of the present technique.

As illustrated in FIG. 6, a speaker 210 according to a fourth embodiment of the present technique includes a round tubular, sheet-like actuator 211, and a holding unit 212, which holds the opposite end portions of the actuator 211. The actuator 211 is the same as the actuator according to the first embodiment except that the elastomer layers and the electrodes have a round tubular shape.

The holding unit 212 includes a shaft 212a and holding members 212b and 212c, which have a disk shape and are provided at the opposite ends of the shaft 212a. The holding members 212b and 212c hold the actuator 111 in a round tubular shape in such a manner that the actuator 211 is subjected to a pre-strain of 50% or more in each of two directions, that is, the height direction and the circumferential direction.

[Advantageous Effects]

In the speaker 210 according to the fourth embodiment, the actuator 211 is subjected to a pre-strain of 50% or more in each of the height direction and the circumferential direction. This configuration can lower the driving voltage of the speaker 210.

[Modification]

The actuator 211 may have a polygonal tubular shape such as quadrangular tubular shape, and the holding members 212b and 212c may have a polygonal shape such as a quadrangular shape.

5 Fifth Embodiment

Figure 7:
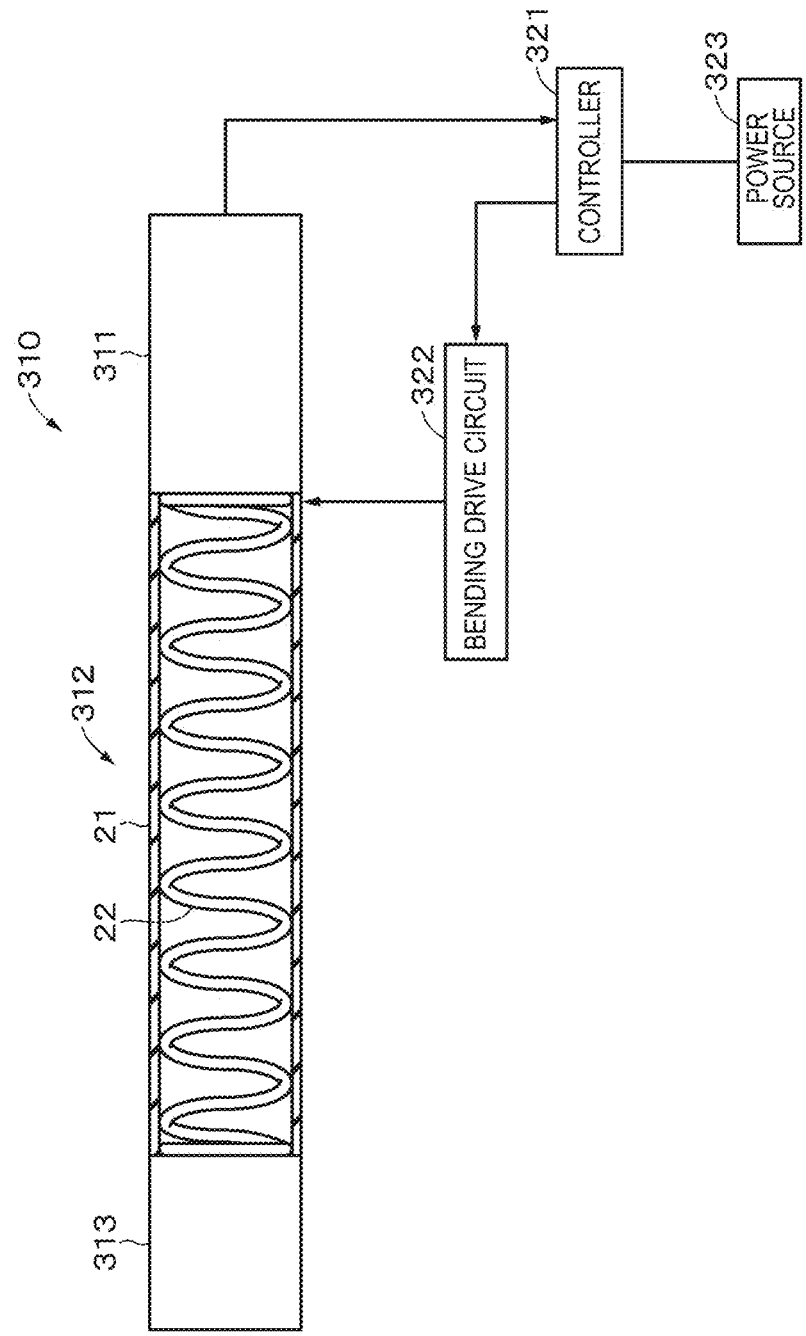
FIG. 7 is a block diagram illustrating an example configuration of an endoscope module according to a fifth embodiment of the present technique.

As illustrated in FIG. 7, an endoscope module according to a fifth embodiment of the present technique includes an endoscope 310 and a controller 321. The controller 321 is connected to a power source 323. It is noted that, in the fifth embodiment, the same parts as those in the second embodiment are denoted by the same characters, and the description thereof is omitted.

The endoscope 310 includes an operation section 311, an actuator 312, which is a bendable section, and a distal end section 313. The operation section 311 has a button, a knob, or the like used to operate the endoscope.

The actuator 312 includes a stack 21 and a coil spring 22. The internal space of the actuator 312 is sealed. One opening of the actuator 312 is closed by the distal end section 313, and the other opening at the other end is closed by the operation section 311. The distal end surface of the distal end section 313 has an illumination lens and an objective lens (not illustrated). A portion of the surface of the distal end section 313 other than the illumination lens and the objective lens is made of, for example, stainless steel or the like. The illumination lens and the objective lens are, for example, glass lenses. An illumination device is provided on the inner side of the illumination lens. An imaging device, such as a charge coupled device (CCD) or a complementary metal oxide semiconductor (CMOS), is provided on the inner side of the objective lens. The imaging device is connected to a display (not illustrated) via an image processor (not illustrated).

The distal end section 313 and the operation section 311 are connected to each other by means of a cable located in the internal space of the actuator 312. An operation signal is sent to the distal end section 313 from the operation section 311 through the cable. In addition, the distal end section 313 and the image processor are connected to each other by means of a cable located in the internal space of the actuator 312. A video signal is sent to the image processor from the distal end section 313 via the cable. However, the operation section 311 may wirelessly send an operation signal to the distal end section 313, and the distal end section 313 may wirelessly send a video signal to the image processor.

The controller 321 controls a bending drive circuit 322 on the basis of the control signal sent from the operation section 311. The bending drive circuit 322 causes the actuator 312 to bend on the basis of the control signal sent from the controller 321. The bending drive circuit 322 may be disposed in the operation section 311.

[Advantageous Effects]

In the endoscope module according to the fifth embodiment, the actuator 312 includes the round tubular stack 21, which is subjected to a pre-strain of 50% or more in the height direction and the circumferential direction. This configuration can lower the driving voltage of the endoscope module.

6 Sixth Embodiment

[Structure of Actuator]

Figure 9:
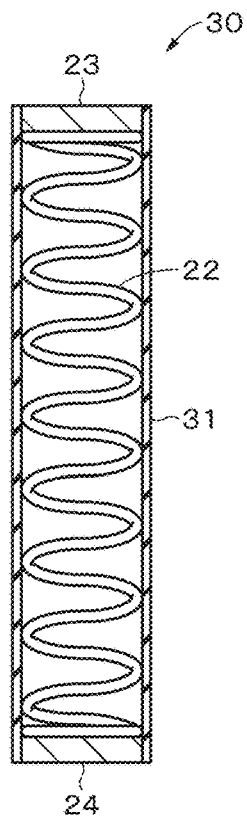
FIG. 9 is a cross-sectional view of an actuator according to a sixth embodiment of the present technique taken in the height direction.

As illustrated in FIG. 9, an actuator 30 according to a sixth embodiment of the present technique includes a round tubular stack 31, a round tubular coil spring 22, which supports the inner circumferential surface of the stack 31, sealing members 23 and 24, which close the openings at the opposite ends of the stack 21. It is noted that, in the sixth embodiment, the same parts as those in the second embodiment are denoted by the same characters, and the description thereof is omitted.

(Stack)

The stack 31 is subjected to a pre-strain in the circumferential direction and no pre-strain in the height direction.

Here, the height direction of the stack 31 corresponds to the driving direction of the actuator 30, and the circumferential direction of the stack 31 corresponds to the direction orthogonal to the driving direction of the actuator 30.

The pre-strain in the circumferential direction of the stack 31 is 50% or more, preferably 80% or more, more preferably 100% or more, and still more preferably 120% or more. The upper limit of the pre-strain in the circumferential direction of the stack 31 is preferably 400% or less, and more preferably 300% or less.

Figure 10:
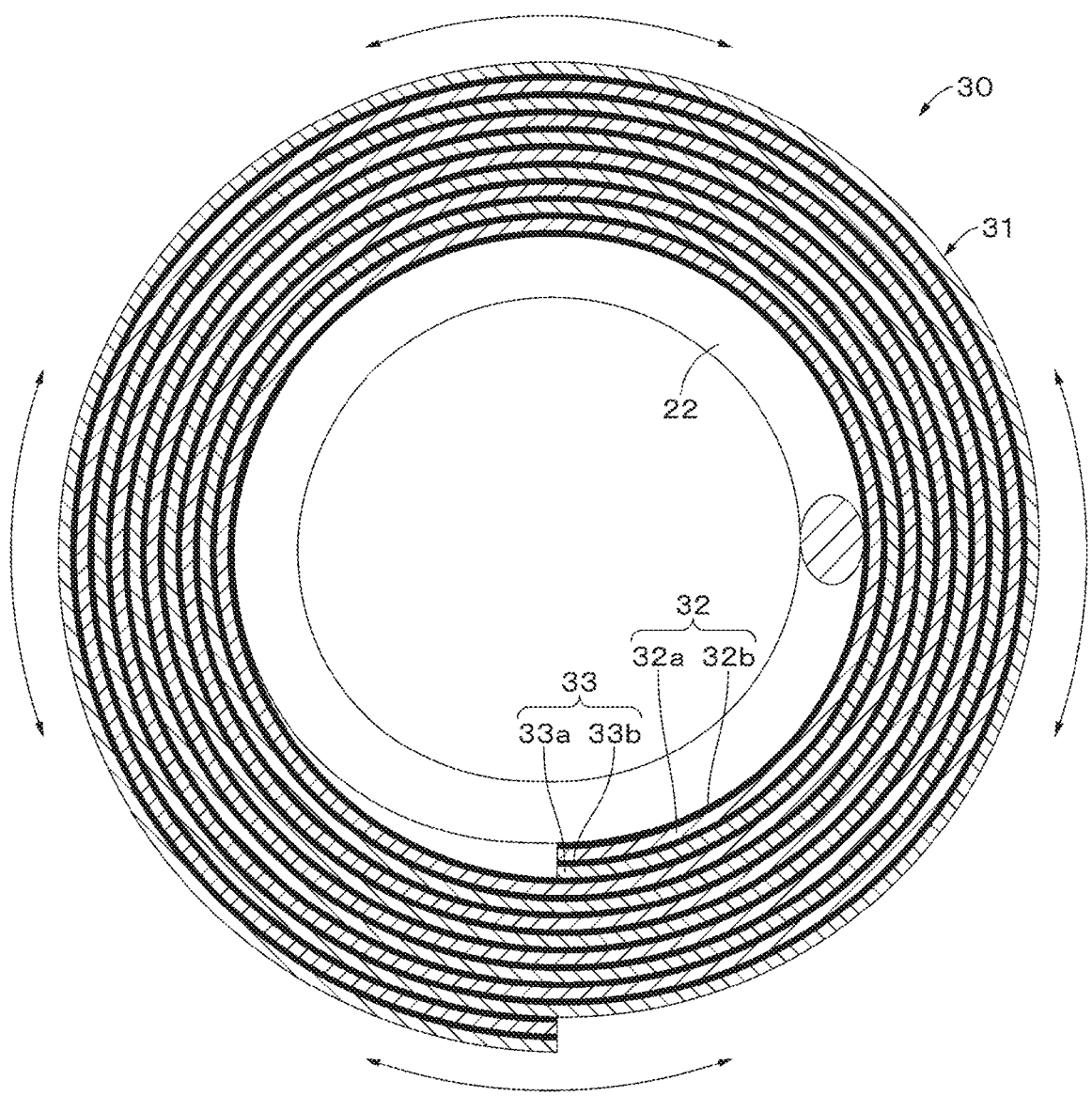
FIG. 10 is a cross-sectional view of the actuator according to the sixth embodiment of the present technique taken in the direction perpendicular to the height direction.

The stack 31 is a main body of the actuator 30. As illustrated in FIG. 10, the stack 31 includes an elongated electrode sheet 32 and an elongated electrode sheet 33. The electrode sheets 32 and 33 are spirally wound around the circumferential surface of the coil spring 22, which serves as a support, in such a manner that one end of each of the electrode sheets 32 and 33 in the longitudinal direction is located on the inner circumferential side, and the other end in the longitudinal direction is located on the outer circumferential side.

The electrode sheet 32 includes an elastomer layer (dielectric layer) 32*a*, which is uniaxially stretched in the circumferential direction and has elasticity, and an electrode 32*b*, which is disposed on one surface of the elastomer layer 32*a* and has elasticity. The elastomer layer 32*a* and the electrode 32*b* both have an elongated rectangular shape. The electrode 32*b* is disposed on one surface of the elastomer layer 32*a* in such a manner that the longitudinal direction of the elastomer layer 32*a* corresponds to the longitudinal direction of the electrode 32*b*.

The electrode sheet 33 includes an elastomer layer (dielectric layer) 33*a*, which is uniaxially stretched in the circumferential direction and has elasticity, and an electrode 33*b*, which is disposed on one surface of the elastomer layer 33*a* and has elasticity. The elastomer layer 33*a* and the electrode 33*b* both have an elongated rectangular shape. The electrode 33*b* is disposed on one surface of the elastomer layer 33*a* in such a manner that the longitudinal direction of the elastomer layer 33*a* corresponds to the longitudinal direction of the electrode 33*b*.

The electrode sheets 32 and 33 are spirally wound in the longitudinal direction of the electrode sheets 32 and 33 in such a manner that the sides of the electrode sheet 32 overlap the respective sides of the electrode sheet 33. The elastomer layer 32*a* or the elastomer layer 33*a* is sandwiched between the wound electrodes 32*b* and 33*b*. Specifically, the electrode sheets 32 and 33 are wound in the longitudinal direction of the electrode sheets 32 and 33 in such a manner that the electrode 32*b*, the elastomer layer 32*a*, the electrode 33*b*, and the elastomer layer 33*a* are repeated in this order from the center to the outer circumference of the stack 31.

Except for the above-described points, the elastomer layer 32*a* and the elastomer layer 33*a* are the same as the elastomer layer 11*b* in the first embodiment. In addition, except for the above-described points, the electrodes 32*b* and 33*b* are the same as the electrode 11*a* in the first embodiment.

[Operation of Actuator]

Next, an example operation of the actuator 30 according to the sixth embodiment of the present technique will be described.

When a driving voltage is applied across the electrodes 32*b* and 33*b* facing each other with the elastomer layer 32*a* or the elastomer layer 33*a* therebetween, an attractive force due to the Coulomb force is generated between the electrodes 32*b* and 33*b*. Thus, the elastomer layer 32*a* or 33*a* disposed between the electrodes 32*b* and 33*b* is pressed in the thickness direction so as to be thinned. The stack 31 is elongated in the height direction (driving direction).

On the other hand, when the driving voltage applied across the electrodes 32*b* and 33*b* facing each other with the elastomer layer 32*a* or the elastomer layer 33*a* therebetween is released, an attractive force due to the Coulomb force is not generated between the electrodes 32*b* and 33*b*. Thus, the elastomer layers 32*a* and 33*a* return to their original thickness and contract to their original size because of the resilience of the elastomer layers 32*a* and 33*a*.

[Method for Manufacturing Actuator]

Next, an example method for manufacturing the actuator according to the sixth embodiment of the present technique will be described.

(Step of Producing Electrode Sheet)

The electrode sheet 32 is produced in the following manner. First, a substrate is provided, and one surface of the substrate undergoes a peel treatment as needed. The substrate may be an inorganic substrate or may be a plastic substrate. In addition, the substrate may be a plate-like substrate or may be a sheet-like substrate.

Next, the coating material for elastomer-layer formation is applied to one surface of the substrate to form a coating film having an elongated rectangular shape. Here, applying includes printing. Subsequently, the coating film formed on one surface of the substrate is dried. The drying conditions are not limited and may be either natural drying or heat drying. Accordingly, the elastomer layer 32*a* is formed on one surface of the substrate. Subsequently, one surface of the elastomer layer 32*a* may undergo an adhesion improving treatment as needed.

Next, the conductive coating material is applied to one surface of the elastomer layer 32*a* to form a coating film having an elongated rectangular shape. Subsequently, the coating film formed on one surface of the elastomer layer 32*a* is dried to form the electrode 32*b*. The drying conditions are not limited and may be either natural drying or heat drying. The electrode sheet 32 is produced accordingly.

The electrode sheet 33 is produced in the same manner as that for the electrode sheet 32.

(Step of Stacking Electrode Sheets)

The stack 31 having an elongated rectangular shape is obtained by placing the electrode sheet 32 on the electrode sheet 33 in such a manner that the sides of the electrode sheet 32 overlap the respective sides of the electrode sheet 33 and the electrode 33*b* faces the elastomer layer 32*a*.

(Step of Winding Stack)

While the obtained stack 31 is uniaxially stretched in the longitudinal direction (circumferential direction), the stack 31 is spirally wound around the circumferential surface of the coil spring 22 in such a manner that one end of the stack 31 in the longitudinal direction is located on the inner circumferential side and the other end of the stack 31 is located on the outer circumferential side.

(Step of Sealing)

First, the sealing members 23 and 24 are fitted to the respective openings at the opposite ends of the stack 31 to close the openings at the opposite ends of the stack 31. Next, the opposite ends of the stack 31 are held by the sealing members 23 and 24 or the opposite ends of the coil spring 22. The actuator 30 illustrated in FIGS. 9 and 10 is obtained accordingly.

[Advantageous Effects]

In the actuator 30 according to the sixth embodiment, the stack 31 is subjected to a pre-strain in the circumferential direction (direction orthogonal to the driving direction) and no pre-strain in the height direction (driving direction). This configuration can improve the resistance dielectric breakdown while maintaining the displacement in the driving direction satisfactory. In addition, the pre-strain in the circumferential direction of the stack 31 makes thin the elastomer layer 32a and the elastomer layer 33a and thus can lower the driving voltage.

[Modifications]

(Modification 1)

The stack 31 may be subjected to a pre-strain in each of the circumferential direction and the height direction. In this case, the pre-strain in the circumferential direction of the stack 31 is preferably larger than the pre-strain in the height direction of the stack 31. More specifically, the pre-strain in the circumferential direction of the stack 31 is 50% or more, preferably 80% or more, more preferably 100% or more, and still more preferably 120% or more. The upper limit of the pre-strain in the circumferential direction of the stack 31 is preferably 400% or less, and more preferably 300% or less. Meanwhile, the pre-strain in the height direction of the stack 31 is less than 50%, preferably 30% or less, more preferably 20% or less, still more preferably 10% or less, and yet still more preferably 5% or less.

(Modification 2)

The electrode sheets 32 and 33 may have a round tubular shape, and the electrode sheets 32 and 33 may be stacked on top of each other concentrically about the coil spring 22 to form the stack 31.

7 Seventh Embodiment

[Structure of Actuator]

Figure 11A:
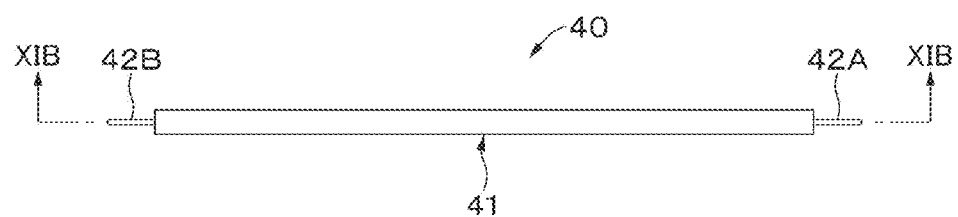
FIG. 11A is a plan view of an example structure of an actuator according to a seventh embodiment of the present technique.

As illustrated in FIG. 11A, an actuator 40 according to a seventh embodiment of the present technique includes a fiber-shaped roll 41, a terminal 42A, which is drawn from one end portion of the roll 41, and a terminal 42B, which is drawn from the other end portion of the roll 41. It is noted that, in the seventh embodiment, the same parts as those in the sixth embodiment are denoted by the same characters, and the description thereof is omitted.

The roll 41 is subjected to a pre-strain in the circumferential direction and no pre-strain in the longitudinal direction. Here, the longitudinal direction of the roll 41 corresponds to the driving direction of the actuator 40, and the circumferential direction of the roll 41 corresponds to the direction orthogonal to the driving direction of the actuator 40.

The roll 41 is an example stack. The roll 41 is the same as the stack 31 in the sixth embodiment except that the roll 41 has no coil spring 22 in a central portion and has a fiber shape. The roll 41 may have or may not have a cavity at the center.

Figure 11B:
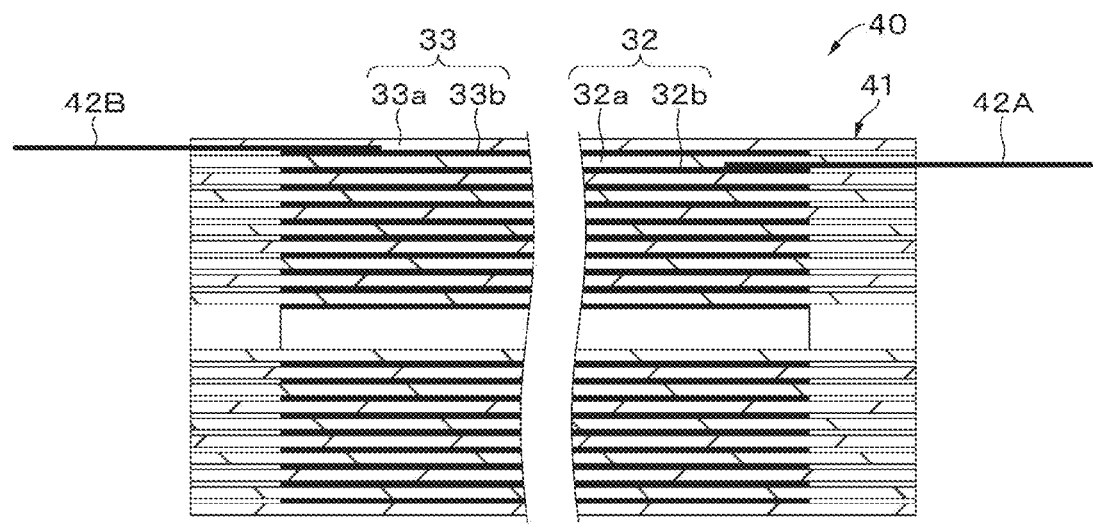
FIG. 11B is a cross-sectional view taken along line XIB-XIB in FIG. 11A.

The terminals 42A and 42B have an elongated shape. As illustrated in FIG. 11B, one end of the terminal 42A is connected to the electrode 32b, and the other end is drawn from one end portion of the roll 41. Furthermore, one end of the terminal 42B is connected to the electrode 33b, and the other end is drawn from the other end portion of the roll 41.

[Advantageous Effects]

In the actuator 40 according to the seventh embodiment, the roll 41, which is an example stack, is subjected to a pre-strain in the circumferential direction (direction orthogonal to the driving direction) and no pre-strain in the longitudinal direction (driving direction). This configuration can improve the resistance to dielectric breakdown while maintaining the displacement in the driving direction satisfactory. In addition, the pre-strain in the circumferential direction of the roll 41 makes thin the elastomer layer 32a and the elastomer layer 33a and thus can lower the driving voltage.

[Modifications]

(Modification 1)

The roll 41 may be subjected to a pre-strain in each of the circumferential direction and the longitudinal direction. In this case, the pre-strain in the circumferential direction of the roll 41 is preferably larger than the pre-strain in the longitudinal direction of the roll 41. More specifically, the pre-strain in the circumferential direction and the pre-strain in the longitudinal direction of the roll 41 are preferably set at the same values as the pre-strain in the circumferential direction and the pre-strain in the longitudinal direction of the stack 31 in Modification 1 of the sixth embodiment, respectively.

(Modification 2)

The electrode sheets 32 and 33 may have a round tubular shape, and the electrode sheets 32 and 33 may be stacked on top of one another to form a fiber-shaped stack.

8 Eighth Embodiment

[Structure of Tactile Presentation Device]

Figure 12:
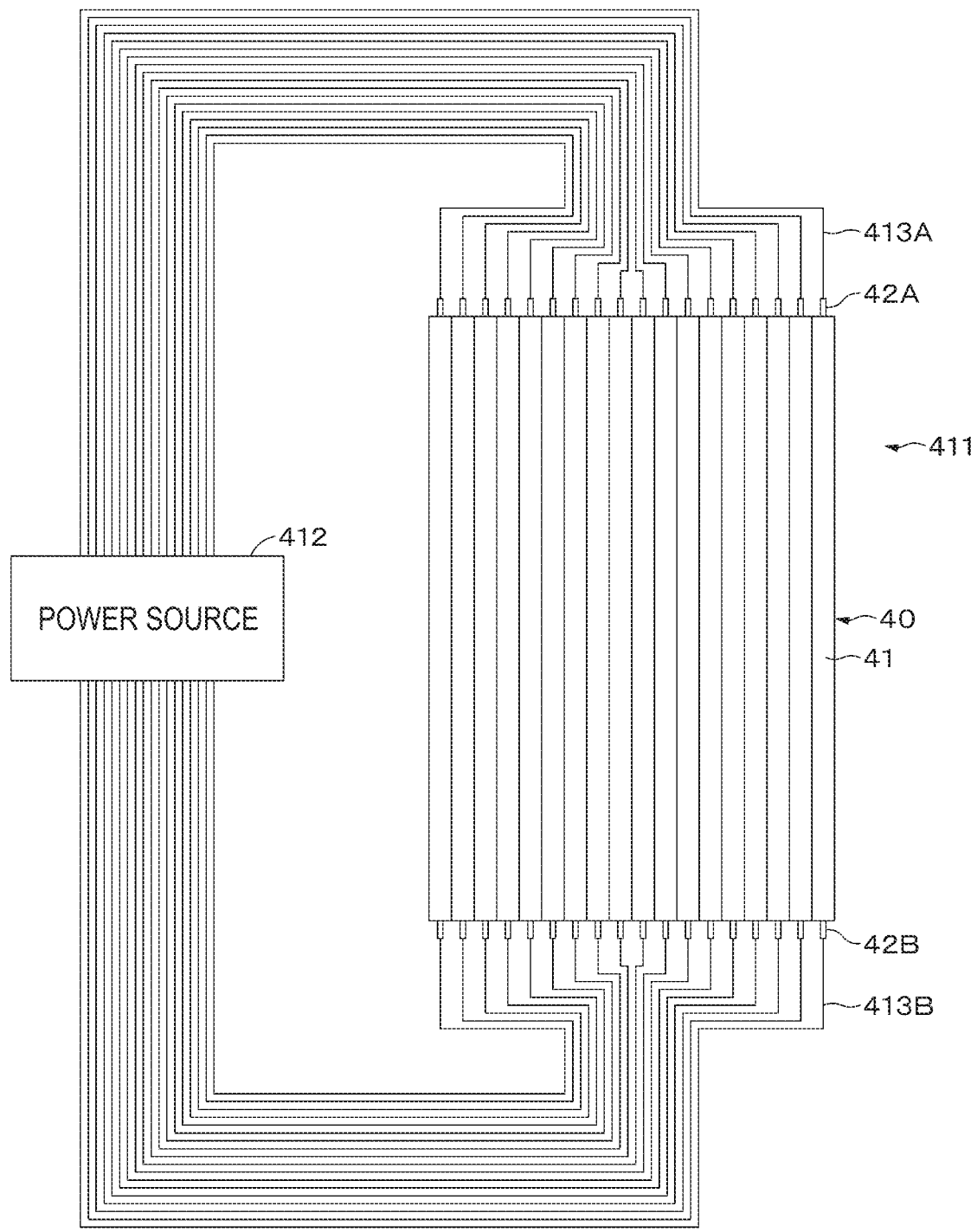
FIG. 12 is a plan view of an example structure of a tactile presentation device according to an eighth embodiment of the present technique.

Referring to FIG. 12, an example where the present technique is applied to a tactile presentation device will be described. The tactile presentation device is an example driving device and includes an actuator array 411, a voltage source 412, and a controller (not illustrated). It is noted that, in the eighth embodiment, the same parts as those in the seventh embodiment are denoted by the same characters, and the description thereof is omitted.

The actuator array 411 is an example driving member and includes a plurality of fiber-shaped actuators 40. The actuators 40 are aligned such that the actuators 40 each have the same longitudinal direction and the circumferential surfaces of the adjacent actuators 40 face each other. A terminal 42A is connected to the voltage source 412 through a wire 413A, whereas a terminal 42B is connected to the voltage source 412 through a wire 413B. The voltage source 412 supplies a driving voltage at a predetermined frequency to each actuator 410 on the basis of a control signal from the controller (not illustrated). Here, the actuators 40 may be the same as that in the modifications of the seventh embodiment.

[Operation of Haptic Presentation Device]

Figure 13A:
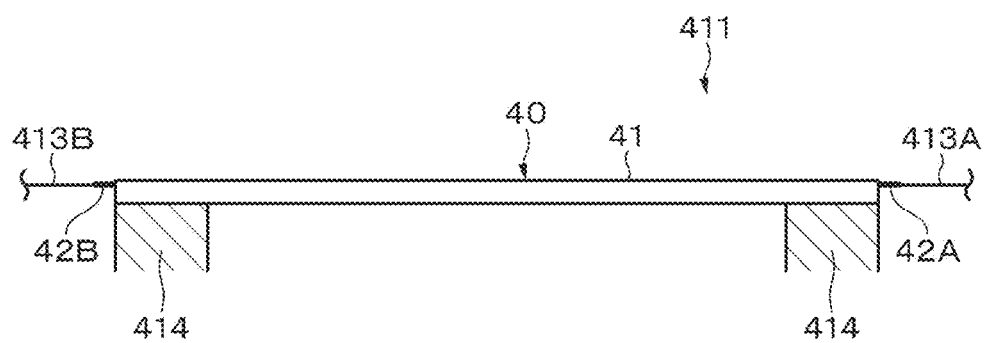
FIGS. 13A and 13B are side views each illustrating an example operation of the tactile presentation device according to the eighth embodiment of the present technique.
Figure 13B:
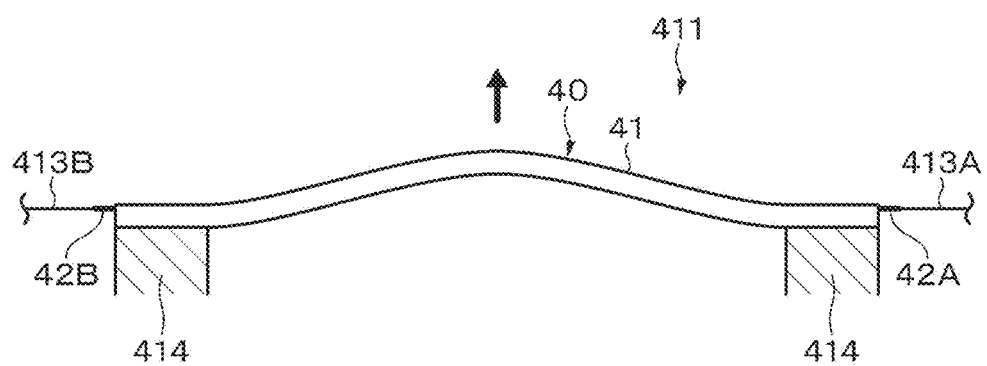

Referring to FIGS. 13A and 13B, an example operation of the tactile presentation device having the above-described structure will be described. Here, as illustrated in FIG. 13A, the case where the opposite ends of the actuator array 411 included in the actuator array 411 are supported by the respective supports 414 will be described.

As illustrated in FIG. 13B, the application of a driving voltage to the actuator 40 causes the actuator 40 to elongate and curve. As illustrated in FIG. 13A, the release of the driving voltage applied to the actuator 40 causes the actuator 40 to contract, return to its original length, and become straight.

[Advantageous Effects]

In the tactile presentation device according to the eighth embodiment, the actuator array 411 includes a plurality of the actuators 40 according to the seventh embodiment. This configuration can improve the resistance of the tactile presentation device to dielectric breakdown and can lower power consumption.

[Modification]

Figure 14:
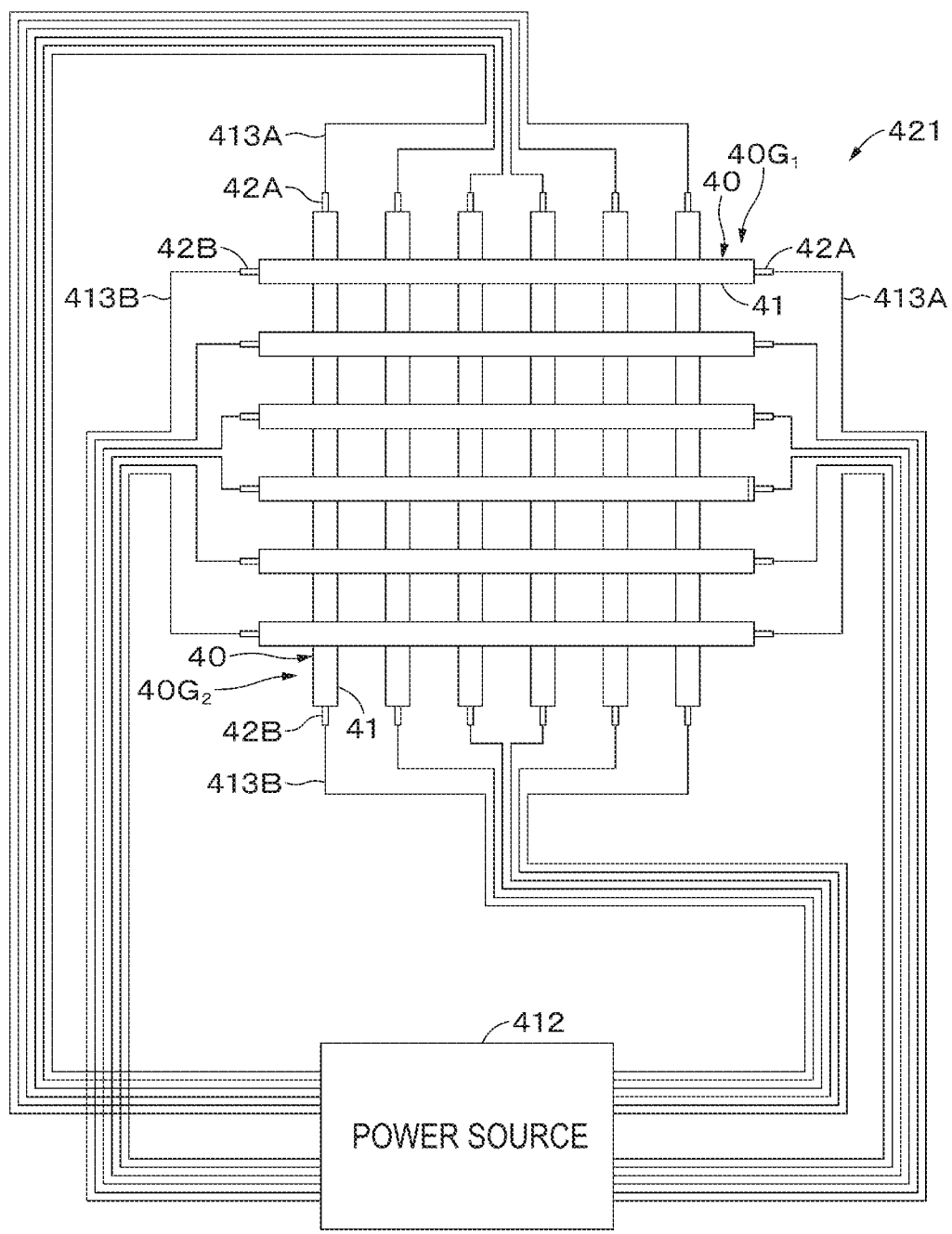
FIG. 14 is a plan view of an example structure of a tactile presentation device according a modification of the eighth embodiment of the present technique.

Referring to FIG. 14, another example where the present technique is applied to a tactile presentation device will be described. The tactile presentation device includes an actuator array 421, a voltage source 412, and a controller (not illustrated). It is noted that, in this modification, the same parts as those in the eighth embodiment are denoted by the same characters, and the description thereof is omitted.

The actuator array 421 includes a plurality of actuators 40, which is two-dimensionally arranged in a grid-like pattern. More specifically, the actuator array 421 includes a first actuator group $40G_1$ and a second actuator group $40G_2$, which is disposed on the first actuator group $40G_1$. The first actuator group $40G_1$ includes a plurality of actuators 40 that is oriented in a first direction. In addition, the second actuator group $40G_2$ includes a plurality of actuators 40 that is oriented in a second direction orthogonal to the first direction. Here, the first direction and the second direction are not necessarily orthogonal to each other.

9 Ninth Embodiment

[Structure of Robot]

Figure 15:
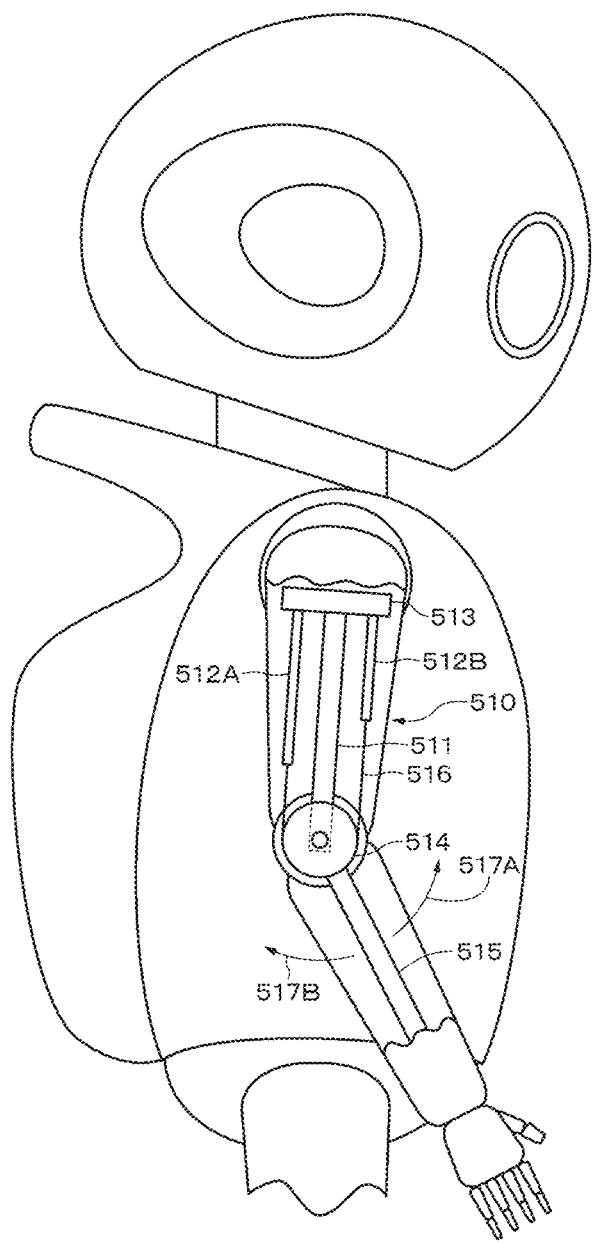
FIG. 15 is a schematic view of an example structure of a robot according to a ninth embodiment of the present technique.

Referring to FIG. 15, an example where the present technique is applied to a robot will be described. The robot includes a joint driving device 510 in the arm.

The joint driving device 510 is an example driving device and includes a columnar member 511; a pair of fiber-shaped actuators 512A and 512B; a support 513, which supports one end of the columnar member 511, one end of the actuator 512A, and one end of the actuator 512B; a rotary member 514, which is rotatably supported at the other end of the columnar member 511; and a drive shaft 515, which is supported by the rotary member 514.

The columnar member 511, the actuators 512A and 512B, and the support 513 are disposed in an upper arm part of the robot arm, and the support 513 is supported in the upper section of the upper arm part. The drive shaft 515 is disposed in a front arm part of the robot arm, and the front arm part moves with driving of the drive shaft 51. The rotary member 514 is disposed in a joint section between the upper arm part and the front arm part of the robot arm and functions as a joint.

A linear member 516, such as a wire, is stretched around the circumferential surface of the rotary member 514. One end of the linear member 516 is connected to the other end of the actuator 512A, and the other end of the linear member 516 is connected to the other end of the actuator 512B. The rotary member 514 can rotate as a result of the expansion/contraction of the actuators 512A and 512B through the linear member.

The actuators 512A and 512B are the same as the actuator 40 according to the seventh embodiment or the modifications thereof.

The robot further includes a voltage source (not illustrated) and a controller (not illustrated). The voltage source is electrically connected to the actuators 512A and 512B through wires. The voltage source supplies a driving voltage to the actuators 512A and 512B on the basis of a control signal from the controller.

[Operation of Robot]

The robot having the above-described structure operates in the following manner. Specifically, the rotary member 514 rotates counterclockwise in FIG. 15 through the linear member 516 when the driving voltage is controlled so as to expand the actuator 512A and contract the actuator 512B by the length corresponding to the expansion of the actuator 512A. This drives the drive shaft 515 in the direction denoted by an arrow 517A. On the other hand, the rotary member 514 rotates clockwise in FIG. 15 through the linear member 516 when the driving voltage is controlled so as to contract the actuator 512A and expand the actuator 512B by the length corresponding to the contraction of the actuator 512A. This drives the drive shaft 515 in the direction denoted by an arrow 517B.

[Advantageous Effects]

The robot according to the ninth embodiment includes the actuator 40 according to the seventh embodiment or the modifications thereof as the actuators 512A and 512B in the joint driving device 510. This configuration can improve robot durability and can lower power consumption.

[Modification]

The seventh embodiment illustrates the structure of the robot including the joint driving device 510 in the arm. However, the robot may include the joint driving device 510 in the leg.

EXAMPLES

The present technique will be specifically described below by way of Examples, but the present technique is not limited only to these Examples.

The following materials are used for Samples 1 to 3 described below. Polyaniline: available from Kakensangyou Corporation, toluene type (6.0 mass % toluene solution)

Poly(styrene-co-ethylenebutylene-co-styrene) (SEBS): available from Kraton Polymers, A1535HU Poly(styrene-co-ethylenebutylene-co-styrene) grafted with maleic anhydride (SEBS-g-MA): available from Kraton Polymers, FG1924GT Acrylic elastomer sheet: available from 3M Company, VHB4905J (initial thickness: 500 μm)

Silicone: available from Smooth-On, Inc., Dragon Skin 30

Silane coupling agent (3-aminopropyltriethoxysilane): available from Sigma-Aldrich Corporation <Sample with Different Amounts of Stretching>

[Sample 1]

First, a first solution of 50 g/L SEBS in toluene and a second solution of 50 g/L SEBS-g-MA in toluene were prepared. It is noted that, since SEBS-g-MA takes a long time to dissolve, a mixture of SEBS-g-MA and toluene was subjected to ultrasonic agitation for 1 hour in the sealed state.

Next, a polymer solution was prepared by mixing the first solution and the second solution such that the first solution: the second solution=1:9 in terms of mass ratio. Subsequently, a solution of 6 mass % polyaniline in toluene was prepared, and this solution was mixed with the polymer solution. At this time, the amount of polyaniline was adjusted to 4.2 mass % relative to the entire solution. After mixing, the mixture was subjected to ultrasonic agitation for about 15 minutes to provide a coating material for electrode formation. To use the coating material as an electrode for dielectric elastomer actuators (DEAs), 1 mass % or more of polyaniline is preferably added in terms of weight ratio.

Subsequently, a rectangular acrylic elastomer sheet subjected to no initial strain was provided, and the coating material for electrode formation was applied to the acrylic elastomer sheet by using a nylon brush and naturally dried. The intended rectangular sheet-like stack was obtained accordingly.

[Sample 2]

A stack was obtained in the same manner as that for Sample 1 except that the stack was stretched so as to be subjected to a pre-strain of 50% (amount of stretching λ=1.5) per side.

[Sample 3]

A stack was obtained in the same manner as that for Sample 1 except that the stack was stretched so as to be subjected to a pre-strain of 100% (amount of stretching λ=2) per side.

[Evaluation]

The stacks of Samples 1 to 3 obtained as described above were evaluated in the following manner.

(Thickness of Stack)

The film thickness of the elastomer layer was obtained from the cross-sectional SEM image.

(Volume Resistivity)

The volume resistivity of the electrode on the stack surface was determined by the four-terminal method in accordance with JIS K 7194-1994.

Figure 8:
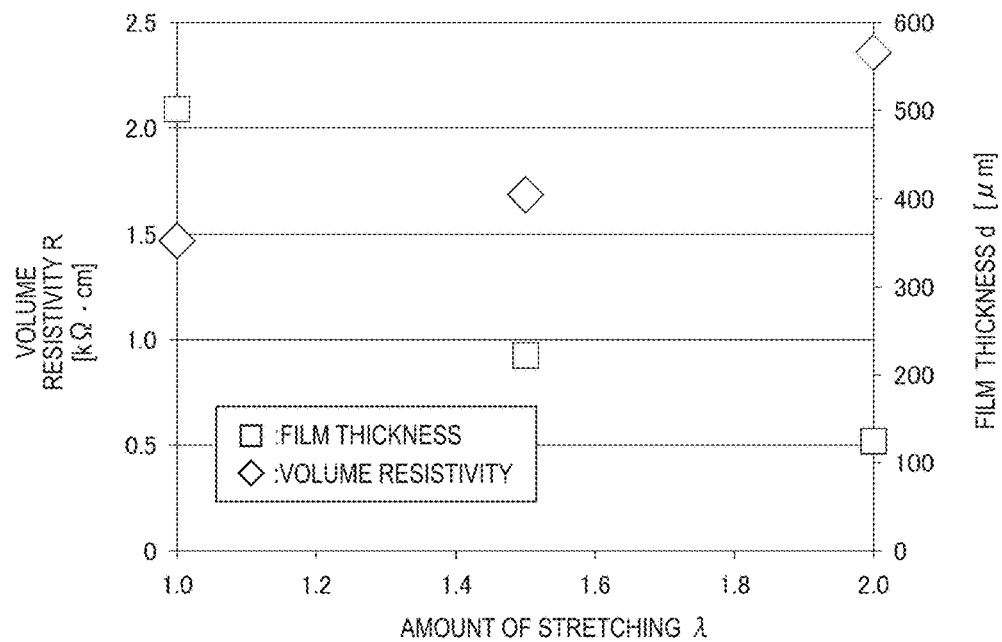
FIG. 8 is a graph showing the relationship among the amount of stretching of the stack, the volume resistivity, and the film thickness.

FIG. 8 shows the evaluation results of the film thickness of the elastomer layer and the volume resistivity for the stacks of Samples 1 to 3. Since the elastomer is an incompressible material, the thickness of the elastomer layer decreases in inverse proportion to the square of the amount λ of biaxial stretching. The resistance of the conformable electrode increases with increasing amount of stretching. This is considered to be because the electrode becomes thinner when stretched. It is noted that actual application of a driving voltage to the stacks of Samples 1 to 3 produced by stretching showed that the stacks of Samples 1 to 3 operated as actuators.

<Sample with Improved Adhesion between Elastomer Layer and Electrode>

[Sample 4]

First, silicone was applied by the bar coating method to form a silicone elastomer sheet having a thickness of 50 μm. Next, the surface of the sheet was subjected to excimer cleaning for 3 minutes, and a silane coupling agent was then applied to the sheet to form a coating film. Subsequently, the same coating material (aniline/SEBS/SEBS-g-MA mixture) for electrode formation as that in Sample 1 was applied onto the coating film and dried to form an electrode. The intended stack was obtained accordingly.

(Tape Peel Test)

First, the electrode was subjected to the cross-cut test in accordance with JIS K 5600-5-6:1999. Next, the condition of the cross-cut section after the test was evaluated on the basis of scales 1 to 5 described above in JIS K 5600-5-6:1999, and the adhesion was graded on the basis of the evaluation results in accordance with the following criteria. As a result, the adhesion was determined to be "good".

Good: corresponding to scales 0 to 2 for the condition described in JIS K 5600-5-6:1999 mentioned above Poor: corresponding to scales 3 to 5 for the condition described in JIS K 5600-5-6:1999 mentioned above It is noted that, in the case of scales 3 to 5, the electrode may be peeled when stretched.

The above-described test results indicate that the adhesion between the elastomer sheet and the electrode can be improved by applying a silane coupling agent to the surface of the silicon sheet after pretreating the surface of the silicon sheet by means of excimer cleaning or the like. It is noted that the adhesion can also be improved by subjecting the surface of the elastomer sheet to only excimer cleansing or UV cleansing.

In Sample 4 described above, a trialkoxysilane coupling agent was used as a silane coupling agent. However, the same adhesion improving effect is also obtained by using a dialkoxysilane coupling agent, a mono-alkoxy silane coupling agent, or the like other than a trialkoxysilane coupling agent. Moreover, an acrylic group, a methacrylic group, an epoxy group, a vinyl group, a styryl group, an isocyanate group, a mercapto group, or the like can be used as a terminal functional group according to the type of polymer.

<Samples Having Different Amounts of Uniaxial Stretching and Different Amounts of Biaxial Stretching and Evaluated for Their Rigidity and Dielectric Breakdown Strength>

[Samples 5-1 to 5-5]

Figure 16A:
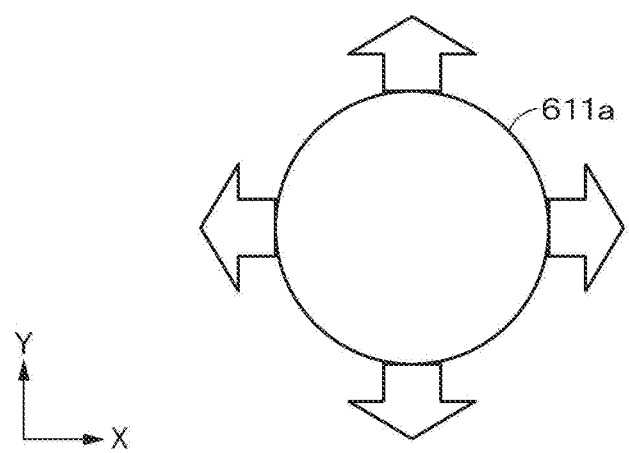
FIG. 16A is a plan view illustrating a step of producing actuators of Samples 5-1 to 5-5.
Figure 17A:
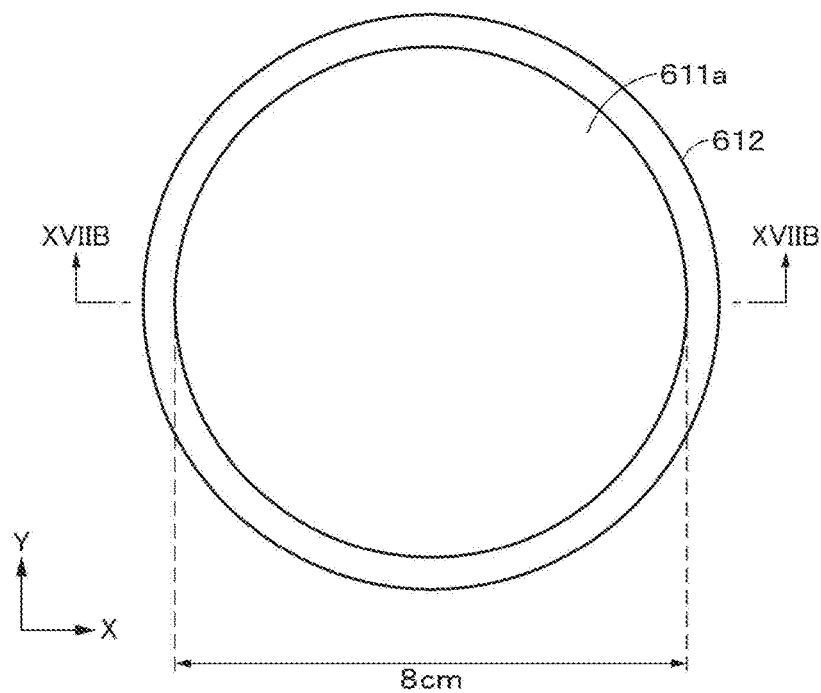
FIG. 17A is a plan view illustrating a step of producing actuators of Samples 5-1 to 5-5 and 6-1 to 6-5.
Figure 17B:
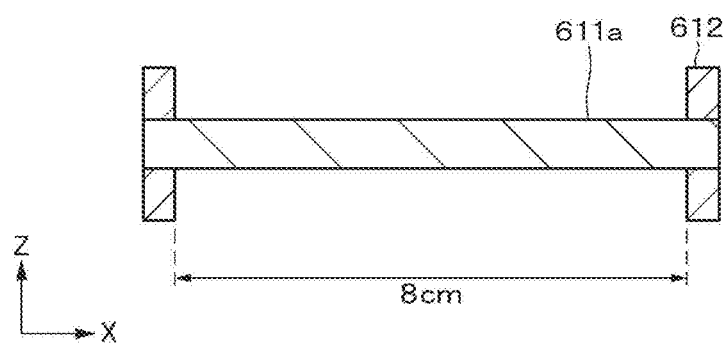
FIG. 17B is a cross-sectional view taken along line XVIIB-XVIIB in FIG. 17A.
Figure 18A:
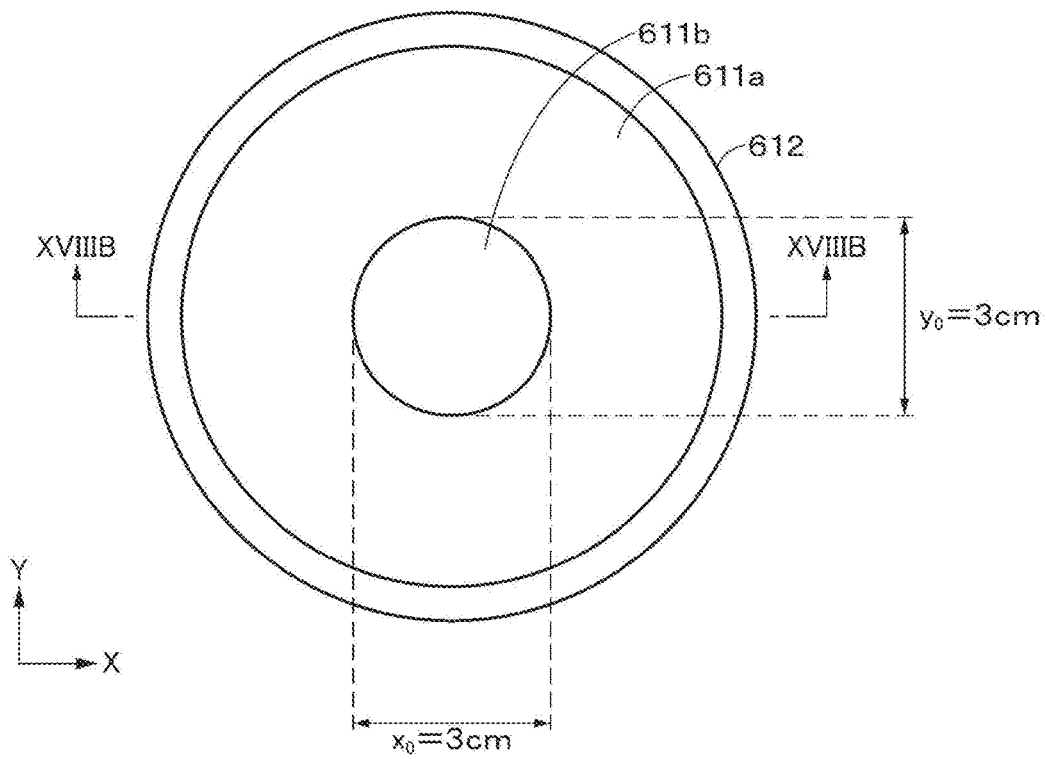
FIG. 18A is a plan view illustrating a step of producing actuators of Samples 5-1 to 5-5 and 6-1 to 6-5.
Figure 18B:
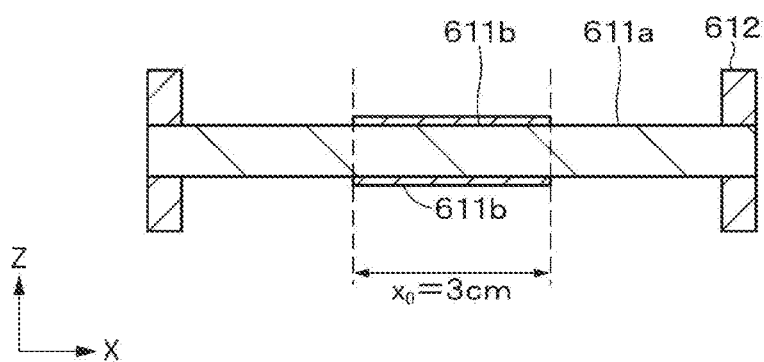
FIG. 18B is a cross-sectional view taken along line XVIIB-XVIIB in FIG. 18A.

First, as illustrated in FIG. 16A, a circular silicone elastomer sheet (elastomer layer) 611a having a thickness of 93 μm was provided, and the elastomer sheet 611a was biaxially stretched in the X- and Y-axis directions. In this case, as shown in Table 1, the stretching ratio in the X- and Y-axis directions was changed for each sample, and the amount of stretching (stretching ratio) was adjusted to 1.14, 1.43, 1.90, 2.38, and 2.86. Next, as illustrated in FIGS. 17A and 17B, the peripheral portion of the biaxially stretched elastomer sheet 611a was fixed to a ring-shaped fixing jig 612 having an inner diameter of 8 cm. Subsequently, as illustrated in FIGS. 18A and 18B, a coating material containing carbon black powder was applied to a central portion of each of both surfaces of the elastomer sheet 611a to form circular electrodes 611b having a diameter of 3 cm. The intended actuators were obtained accordingly.

[Samples 6-1 to 6-5]

Figure 16B:
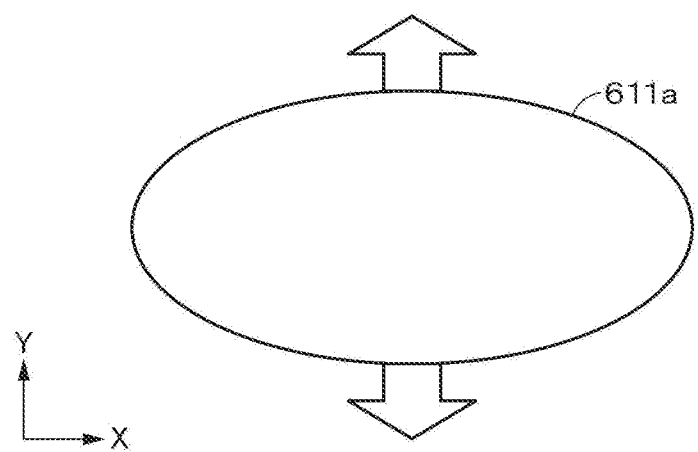
FIG. 16B is a plan view illustrating a step of producing actuators of Samples 6-1 to 6-5.

First, as illustrated in FIG. 16B, an elliptical silicone elastomer sheet (elastomer layer) 611a having a thickness of 93 μm was provided, and the elastomer sheet 611a was uniaxially stretched in the Y-axis direction (minor axis direction). In this case, as shown in Table 2, the stretching ratio in the Y-axis directions was changed for each sample, and the amount of stretching (stretching ratio) was adjusted to 1.43, 1.90, 2.38, 2.86, and 3.81. The subsequent steps were performed in the same manner as those for Samples 5-1 to 5-5. The intended actuators were obtained accordingly.

[Evaluation of Rigidity and Dielectric Breakdown Strength]

Figure 19A:
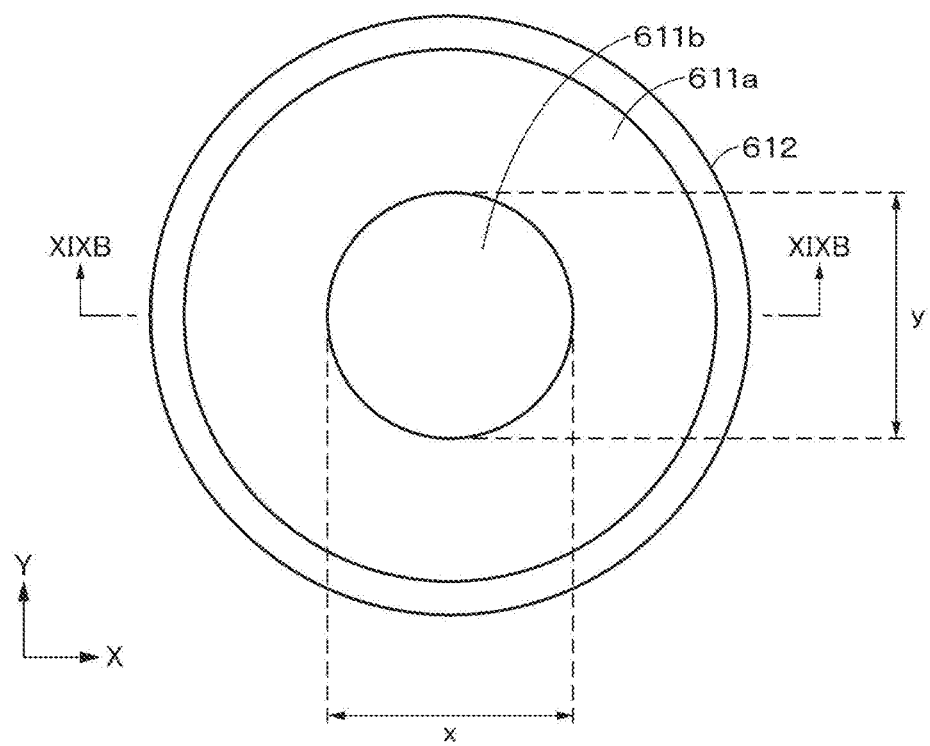
FIG. 19A is a plan view of actuators of Samples 5-1 to 5-5 and 6-1 to 6-5 when a voltage is applied.
Figure 19B:
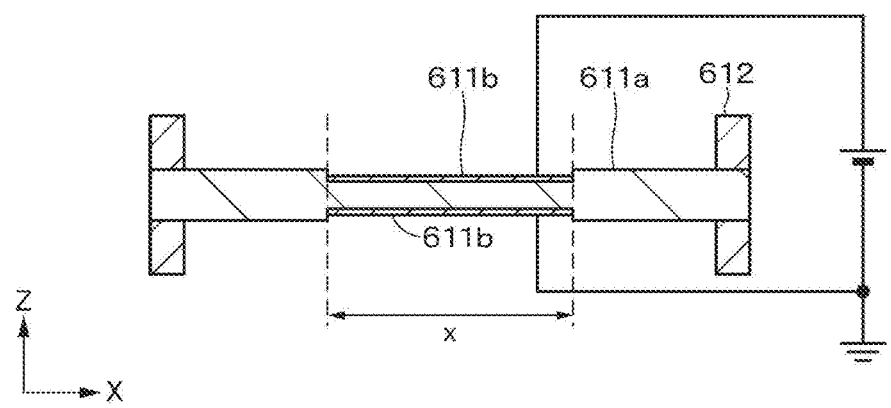
FIG. 19B is a cross-sectional view taken along line XIXB-XIXB in FIG. 19A.

The actuators of Samples 5-1 to 5-5 and 6-1 to 6-5 obtained as described above were evaluated for their rigidity and dielectric breakdown strength. First, as illustrated in FIGS. 19A and 19B, the voltage applied to the electrodes 611b and 611b was gradually increased, and the voltage (hereinafter referred to as "dielectric withstanding voltage") V and the electrode widths x and y immediately before dielectric breakdown were measured. Next, the dielectric breakdown strength E, the rigidity $E_X$ in the X-axis direction, and the rigidity $E_Y$ in the Y-axis direction were calculated from the results on the basis of the following formula.

$$\text{Dielectric breakdown strength } E=(V/t_0)\times((x\times y)/(x_0\times y_0))$$

It is noted that, in the formula, V: dielectric withstanding voltage, to: initial thickness, x: electrode width in X-axis direction, y: electrode width in Y-axis direction, $x_0$: electrode width in X-axis direction in initial state, and $y_0$: electrode width in Y-axis direction in initial state. Here, the initial state means the state before voltage application.

$$\text{Rigidity } E_X \text{ in } x\text{-axis direction}=\sigma/\varepsilon_X$$

$$\text{Rigidity } E_Y \text{ in } y\text{-axis direction}=\sigma/\varepsilon_Y$$

It is noted that, in the formula, σ: Maxwell stress, $\varepsilon_X$: strain in X-axis direction, and $\varepsilon_Y$: strain in Y-axis direction, which are obtained from the following respective formulas.

$$\sigma=\varepsilon\times E^2 \text{ (where } \varepsilon\text{: permittivity)}$$

$$\varepsilon_X=x/x_0$$

$$\varepsilon_Y=y/y_0$$

Table 1 shows the evaluation results of the actuators of Samples 5-1 to 5-5.

TABLE 1

| Sample No. | 5-1 | 5-2 | 5-3 | 5-4 | 5-5 |
|---|---|---|---|---|---|
| Dielectric withstanding voltage [V] | 5400 | 4250 | 3400 | 2600 | 2000 |
| Thickness [μm] of elastomer layer before stretching | 93 | 93 | 93 | 93 | 93 |
| Stretching ratio in x-axis direction | 1.14 | 1.43 | 1.90 | 2.38 | 2.86 |
| Stretching ratio in y-axis direction | 1.14 | 1.43 | 1.90 | 2.38 | 2.86 |
| Initial thickness [μm] of elastomer layer | 71.20 | 45.57 | 25.63 | 16.41 | 11.39 |
| Permittivity [F/m] | 2.48E−11 | 2.48E−11 | 2.48E−11 | 2.48E−11 | 2.48E−11 |
| Initial electrode electrode width [cm] in x-axis direction | 3.00 | 3.00 | 3.00 | 3.00 | 3.00 |
| Initial electrode width [cm] in y-axis direction | 3.00 | 3.00 | 3.00 | 3.00 | 3.00 |
| Electrode width [cm] in x-axis direction after stretching | 3.40 | 4.03 | 3.75 | 3.44 | 3.13 |
| Electrode width [cm] in y-axis direction after stretching | 3.40 | 4.03 | 3.75 | 3.44 | 3.13 |
| Dielectric breakdown strength [MV/m] | 97.51 | 168.20 | 207.79 | 208.92 | 190.57 |
| Maxwell stress [Mpa] | 0.24 | 0.70 | 1.07 | 1.08 | 0.90 |
| Rigidity in x-axis direction [Mpa] | 1.76 | 2.04 | 4.25 | 7.30 | 21.49 |
| Rigidity in y-axis direction [Mpa] | 1.76 | 2.04 | 4.25 | 7.30 | 21.49 |

Table 2 shows the evaluation results of the actuators of Samples 6-1 to 6-5.

TABLE 2

| Sample No. | 6-1 | 6-2 | 6-3 | 6-4 | 6-5 |
|---|---|---|---|---|---|
| Dielectric withstanding voltage [V] | 5800 | 4750 | 4500 | 3900 | 3400 |
| Thickness [μm] of elastomer layer before stretching | 93 | 93 | 93 | 93 | 93 |
| Stretching ratio in x-axis direction | 1.00 | 1.00 | 1.00 | 1.00 | 1.00 |
| Stretching ratio in y-axis direction | 1.43 | 1.90 | 2.38 | 2.86 | 3.81 |
| Initial thickness [μm] of elastomer layer | 65.10 | 48.83 | 39.06 | 32.55 | 24.41 |
| Permittivity [F/m] | 2.48E−11 | 2.48E−11 | 2.48E−11 | 2.48E−11 | 2.48E−11 |
| Initial electrode width [cm] in x-axis direction | 3.00 | 3.00 | 3.00 | 3.00 | 3.00 |
| Initial electrode width [cm] in y-axis direction | 3.00 | 3.00 | 3.00 | 3.00 | 3.00 |
| Electrode width [cm] in x-axis direction after stretching | 3.24 | 3.37 | 3.50 | 3.68 | 3.49 |
| Electrode width [cm] in y-axis direction after stretching | 3.27 | 3.41 | 3.49 | 3.53 | 3.09 |
| Dielectric breakdown strength [MV/m] | 104.84 | 124.19 | 156.39 | 172.83 | 166.83 |
| Maxwell stress [Mpa] | 0.27 | 0.38 | 0.61 | 0.74 | 0.69 |
| Rigidity in x-axis direction [Mpa] | 3.38 | 3.12 | 3.62 | 3.26 | 4.23 |
| Rigidity in y-axis direction [Mpa] | 3.06 | 2.79 | 3.72 | 4.22 | 23.09 |

It is noted that the expression "AE-B" in the section of "permittivity" in Tables 1 and 2 means $A \times 10^{-B}$.

Figure 20A:
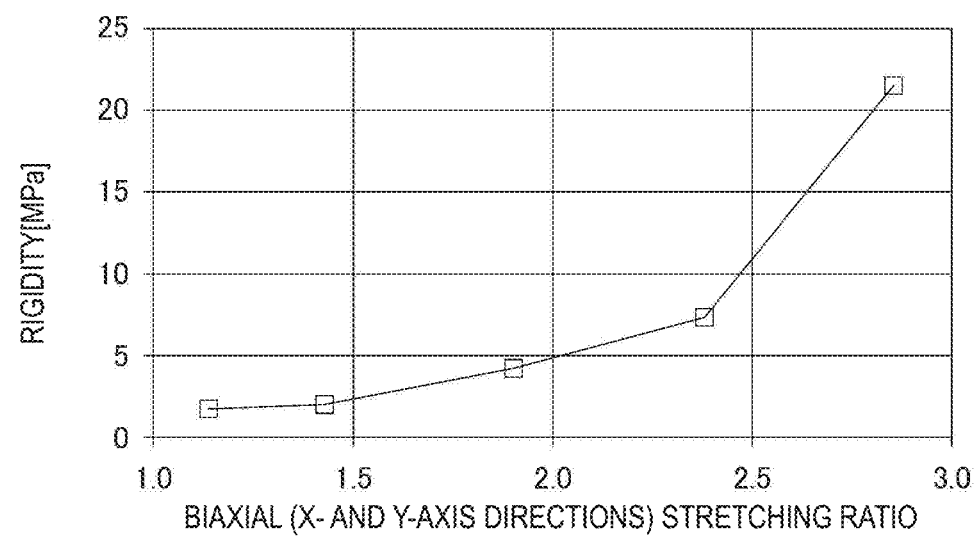
FIG. 20A is a graph showing the relationship between the biaxial stretching ratio and the rigidity.
Figure 20B:
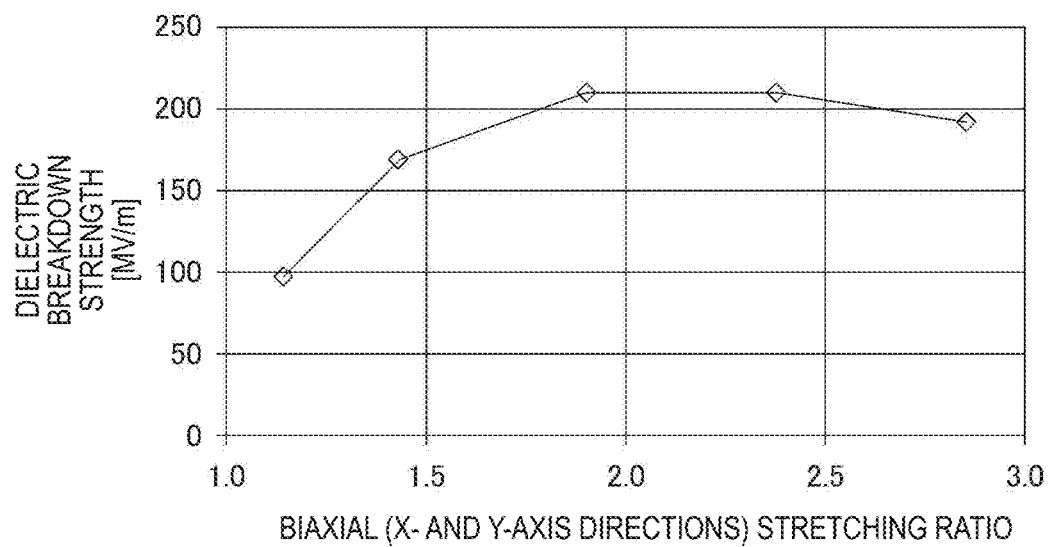
FIG. 20B is a graph showing the relationship between the biaxial stretching ratio and the dielectric breakdown strength.
Figure 21A:
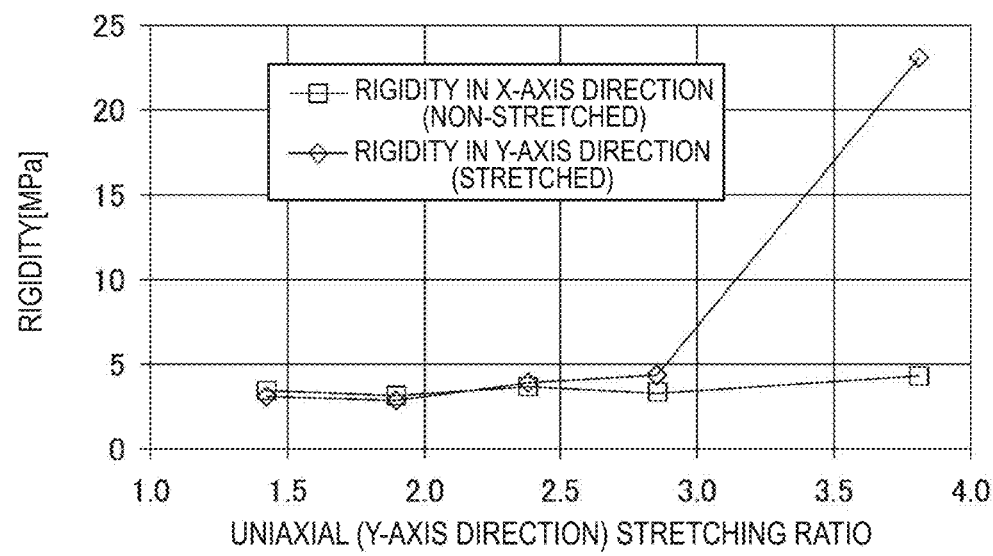
FIG. 21A is a graph showing the relationship between the uniaxial stretching ratio and the rigidity.
Figure 21B:
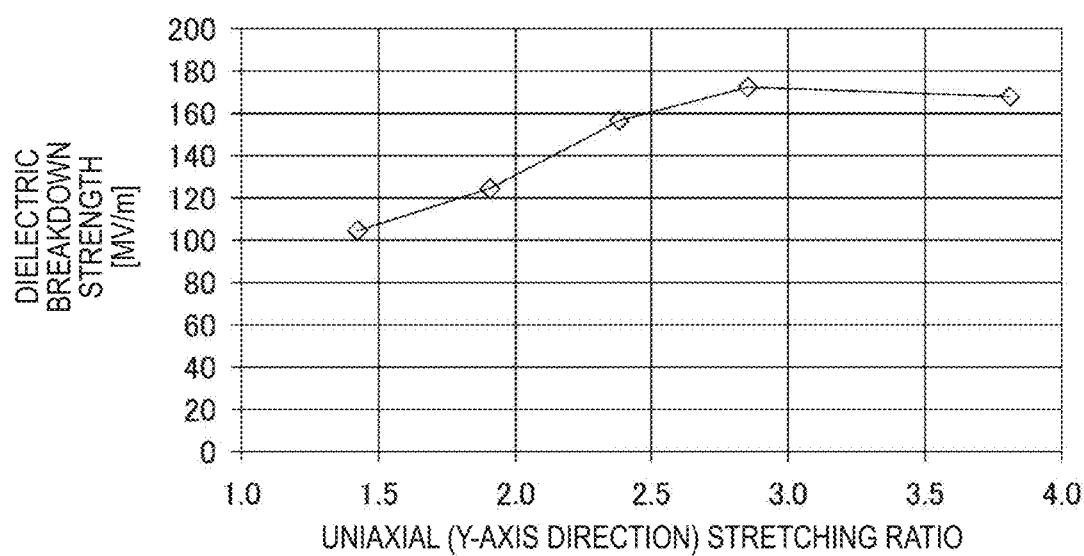
FIG. 21B is a graph showing the relationship between the uniaxial stretching ratio and the dielectric breakdown strength.

FIG. 20A shows the relationship between the biaxial stretching ratio and the rigidity. FIG. 20B shows the relationship between the biaxial stretching ratio and the dielectric breakdown strength. FIG. 21A shows the relationship between the uniaxial stretching ratio and the rigidity. FIG. 21B shows the relationship between the uniaxial stretching ratio and the dielectric breakdown strength.

FIGS. 20A and 20B reveal the following facts. Specifically, in a case where the elastomer sheet 611a is biaxially stretched in the X- and Y-axis directions, the rigidity increases with increasing biaxial stretching ratio. In addition, the dielectric breakdown strength increases with increasing biaxial stretching ratio.

FIGS. 21A and 21B reveal the following facts. Specifically, in a case where the elastomer sheet 611a is uniaxially stretched in the y-axis direction, the rigidity in the X-axis direction is substantially constant with increasing uniaxial stretching ratio. However, the rigidity in the Y-axis direction increases with increasing uniaxial stretching ratio. In addition, the dielectric breakdown strength increases with increasing uniaxial stretching ratio.

Therefore, uniaxial stretching of the actuator in the direction perpendicular to the driving direction can improve the resistance to dielectric breakdown while maintaining the displacement in the driving direction satisfactory.

<Samples Containing Different Carbon Fillers as Electrode Material>
[Sample 7-1]

Figure 22A:
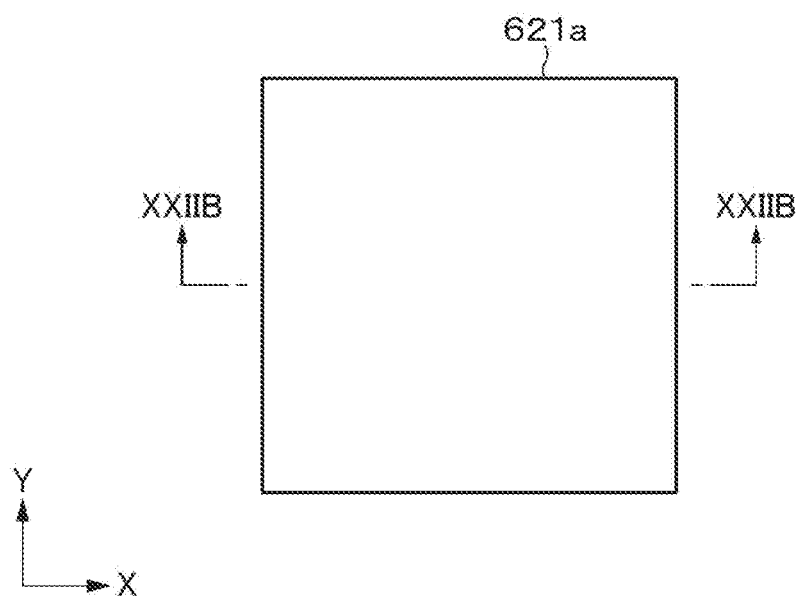
FIG. 22A is a plan view illustrating a step of producing actuators of Samples 7-1 to 7-3.
Figure 22B:
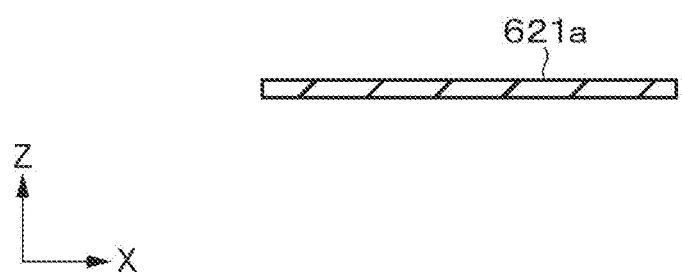
FIG. 22B is a cross-sectional view taken along line XXIIB-XXIIB in FIG. 22A.
Figure 23A:
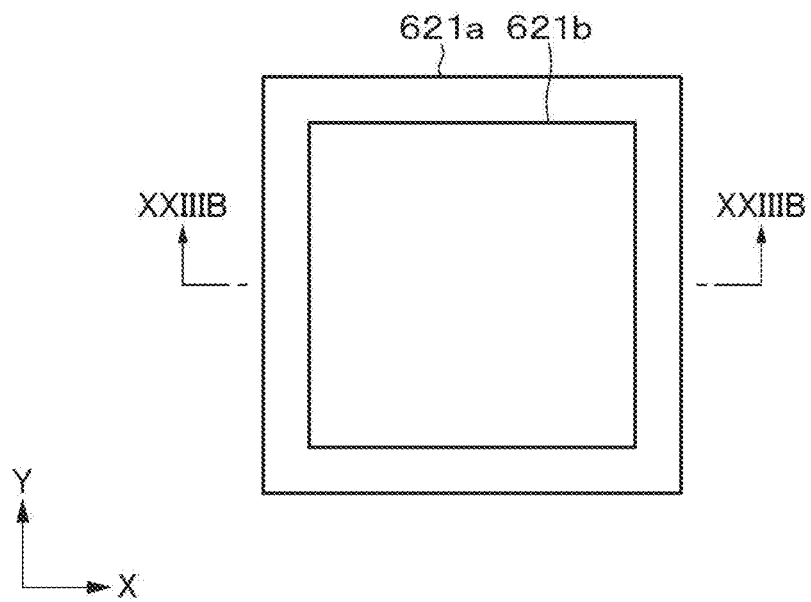
FIG. 23A is a plan view illustrating a step of producing actuators of Samples 7-1 to 7-3.
Figure 23B:
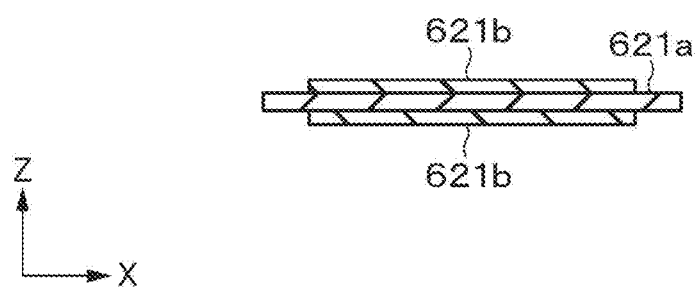
FIG. 23B is a cross-sectional view taken along line XXIIIB-XXIIIB in FIG. 23A.

First, as illustrated in FIGS. 22A and 22B, a square silicone elastomer sheet 621a having a size of 15 cm×15 cm was provided. Next, as illustrated in FIGS. 23A and 23B, a rectangular electrode 621b having a size of 10 cm×10 cm was formed on a central portion of the elastomer sheet 621a by means of spray coating.

The process for forming the electrode 621b will be described below in detail.
(Preparation of Carbon Filler Solution)

Nanocarbon and isopropanol were mixed at a mass ratio of 1:20 (nanocarbon:isopropanol). The mixture was placed in a polypropylene case, 50 ml capacity, (AS ONE Corporation, Aiboy, wide mouth, PP) together with 6 zirconia beads, 10 mm in diameter, and agitated by shaking for 10 minutes. It is noted that DENKA BLACK Li (Li-100, mean particle size: 35 nm) available from Denka Company Limited was used as nanocarbon. In addition, Vortex was used for shaking.
(Preparation of Elastomer Solution)

A solution of 20 mass % (in terms of mass ratio) elastomer (binder) in toluene was prepared. A silicone resin (available from Dow Corning Toray Co., Ltd., MS1003) was used as an elastomer.
(Preparation of Solution)

First, the carbon filler solution and the elastomer solution were mixed such that the mass ratio (carbon filler:elastomer)

of the carbon filler to the elastomer was 10:90, and zirconia beads were added to the mixture, followed by agitation for 10 minutes. Subsequently, zirconia beads were removed. A carbon-silicone solution was obtained accordingly.

(Production of Coating Electrode)

The carbon-silicone solution obtained as described above was sprayed onto the elastomer sheet 621a from a distance of about 30 cm by using an air spray gun (FS110 round pattern type) available from Meiji Air Compressor Mfg. Co., Ltd. so as to form a uniform coating as visually observed. The air flow rate was set to the conditions obtained as follows: connecting a houseline of about 0.15 MPa to the air spray gun; and releasing the gas flow control nozzle of FS110 by one and half turns. Accordingly, the electrode 621b having a surface roughness (peak to peak distance) of about 20 μm and a thickness of about 10 μm was formed. The intended actuator is obtained accordingly.

[Sample 7-2]

An actuator was obtained in the same manner as that for Sample 7-1 except that DENKA BLACK Li (Li-250, mean particle size: 37 nm) available from Denka Company Limited was used as nanocarbon.

[Sample 7-3]

An actuator was obtained in the same manner as that for Sample 7-1 except that DENKA BLACK Li (Li-400, mean particle size: 48 nm) available from Denka Company Limited was used as nanocarbon.

[Evaluation of Conductivity of Electrode]

First, the end portions of the actuator were fixed so as to prevent buckling, and a four-terminal probe was then brought into contact with the upper surface (the surface of the electrode 621b) of the actuator in the non-stretched state (the stretching ratio in the X-axis direction: 1, the stretching ratio in the Y-axis direction: 1) to measure the resistance. Next, the film thickness of the electrode 621b was measured with a profilometer to determine the cross-sectional area of the electrode 621b. The resistivity of the electrode 621b was then calculated by using the resistance and the cross-sectional area of the electrode 621b obtained as described above.

carbon filler (available from Denka Company Limited, DENKA BLACK Li (Li-100)) to an elastomer (available from Dow Corning Toray Co., Ltd., MS1003) was 19:81, 24:76, 30:70, and 35:65.

[Evaluation of Conductivity in Biaxial Stretching]

Figure 25A:
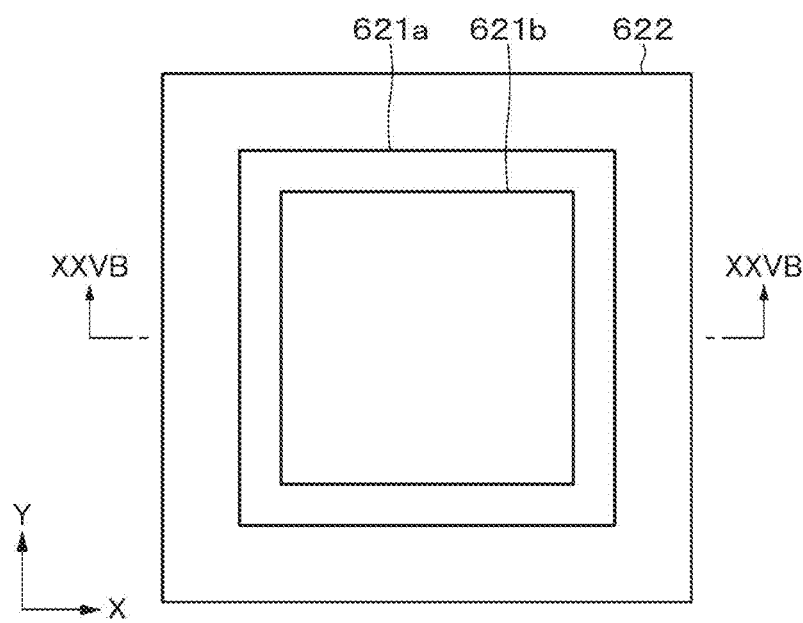
FIG. 25A is a plan view illustrating the method for evaluating the conductivity of actuators of Samples 8-1 to 8-4.
Figure 25B:
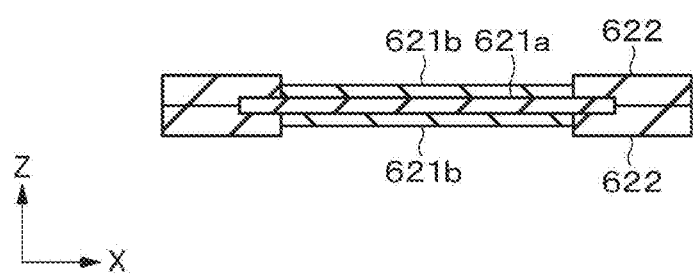
FIG. 25B is a cross-sectional view taken along line XXVB-XXVB in FIG. 25A.
Figure 26A:
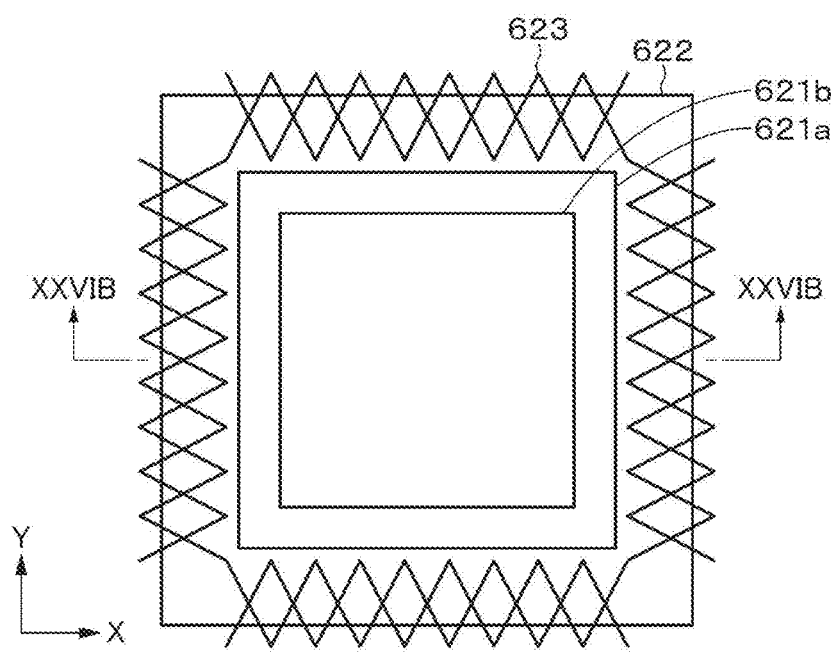
FIG. 26A is a plan view illustrating the method for evaluating the conductivity of actuators of Samples 8-1 to 8-4.
Figure 26B:
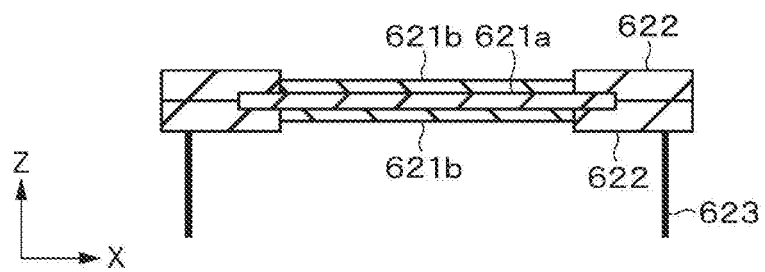
FIG. 26B is a cross-sectional view taken along line XXVIB-XXVIB in FIG. 26A.
Figure 27A:
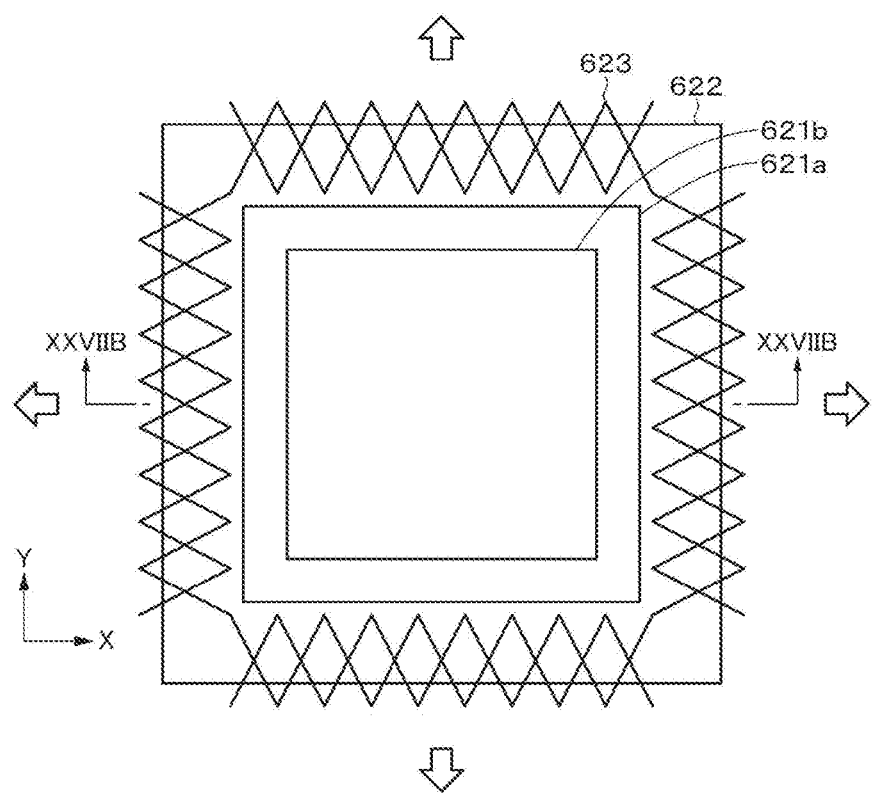
FIG. 27A is a plan view illustrating the method for evaluating the conductivity of actuators of Samples 8-1 to 8-4.
Figure 27B:
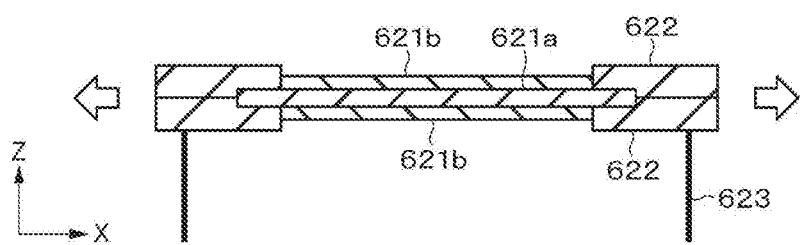
FIG. 27B is a cross-sectional view taken along line XXVIIB-XXVIIB in FIG. 27A.

First, a pair of elastomer sheets 622 was prepared by cutting a double-sided adhesive acrylic elastomer sheet (available from 3M, VHB4905J) into a hollow rectangular shape. Subsequently, as illustrated in FIGS. 25A and 25B, a portion of the elastomer sheet 621a on which no electrodes 621b were formed was sandwiched between the pair of elastomer sheets 622 to form a section to be fixed to a jig. Next, as illustrated in FIGS. 26A and 26B, the four sides of the elastomer sheet 622 were fixed to a biaxial stretching jig 623 and, as illustrated in FIGS. 27A and 27B, the elastomer sheet 622 was then biaxially stretched (the stretching ratio in the X-axis direction: 1 to 3.25, the stretching ratio in the Y-axis direction: 1 to 3.25).

Figure 28A:
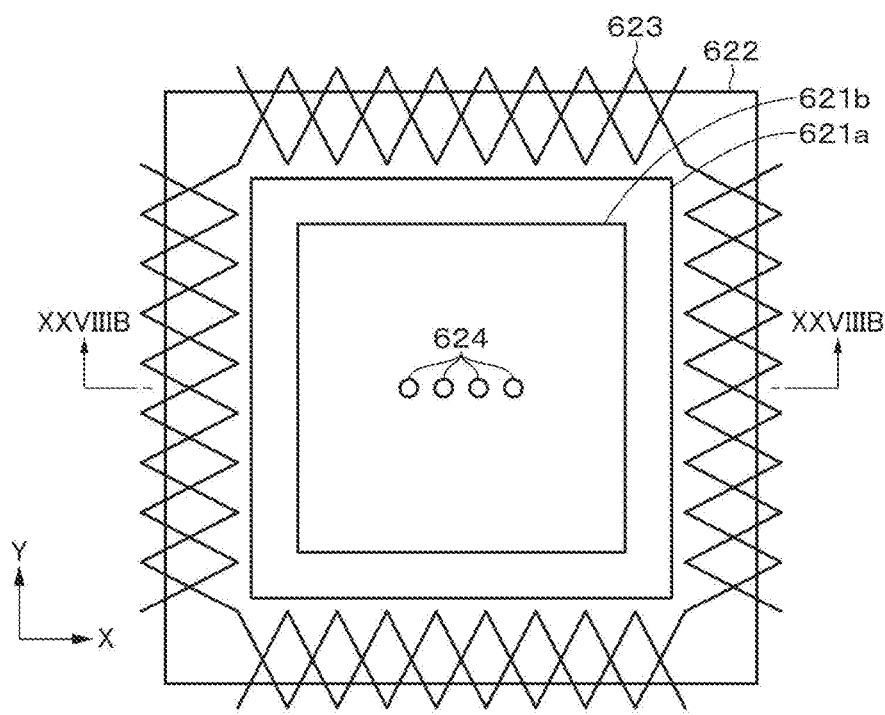
FIG. 28A is a plan view illustrating the method for evaluating the conductivity of actuators of Samples 8-1 to 8-4.
Figure 28B:
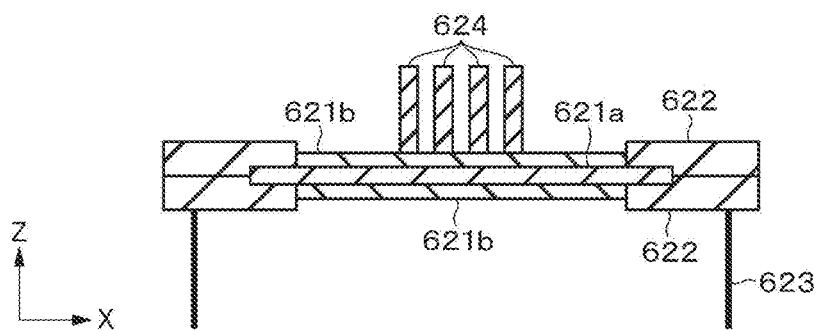
FIG. 28B is a cross-sectional view taken along line XXVIIIB-XXVIIIB in FIG. 28A.

Next, a digital multimeter (2800 Digital Multi-mater available from Keithley Instruments) equipped with a four-terminal probe 624 in accordance with JIS K 7194 standard was provided and, as illustrated in FIGS. 28A and 28B, the four-terminal probe 624 was brought into contact with the upper surface (the surface of the electrode 621b) of the actuator in the stretched state to measure the resistance. Next, the film thickness of the electrode 621b was measured with a profilometer to determine the cross-sectional area of the electrode 621b. The resistivity of the electrode 621b was then calculated by using the resistance and the cross-sectional area of the electrode 621b obtained as described above. It is noted that the resistivity was calculated in each 0.25-times increment of the stretching ratio.

[Evaluation of Conductivity in Uniaxial Stretching]

The resistivity was measured in the same manner as that in the evaluation of the conductivity in biaxial stretching described above except that the stretching was uniaxial stretching and the stretching ratio was in the range from 1 to 3.25.

Table 3 shows the evaluation results of the actuators of Samples 8-1 to 8-4.

TABLE 3

| | Amount of carbon added [mass %] | Biaxial stretching ratio | | | | | | | | | |
|---|---|---|---|---|---|---|---|---|---|---|---|
| | | 1 | 1.25 | 1.5 | 1.75 | 2 | 2.25 | 2.5 | 2.75 | 3 | 3.25 |
| Sample 8-1 | 19 | 2.72 | 2.11 | 2.00 | 2.65 | 11.15 | 12.95 | — | — | — | — |
| Sample 8-2 | 24 | 2.23 | 2.04 | 2.02 | 3.29 | 7.05 | 8.20 | 14.55 | 28.81 | 61.71 | — |
| Sample 8-3 | 30 | 0.30 | 0.25 | 0.32 | 0.31 | 0.58 | 1.07 | 1.44 | 1.94 | 4.73 | — |
| Sample 8-4 | 35 | 0.26 | 0.34 | 0.31 | 0.36 | 0.78 | 1.33 | 1.79 | 3.82 | 6.04 | 22.90 |

Figure 24:
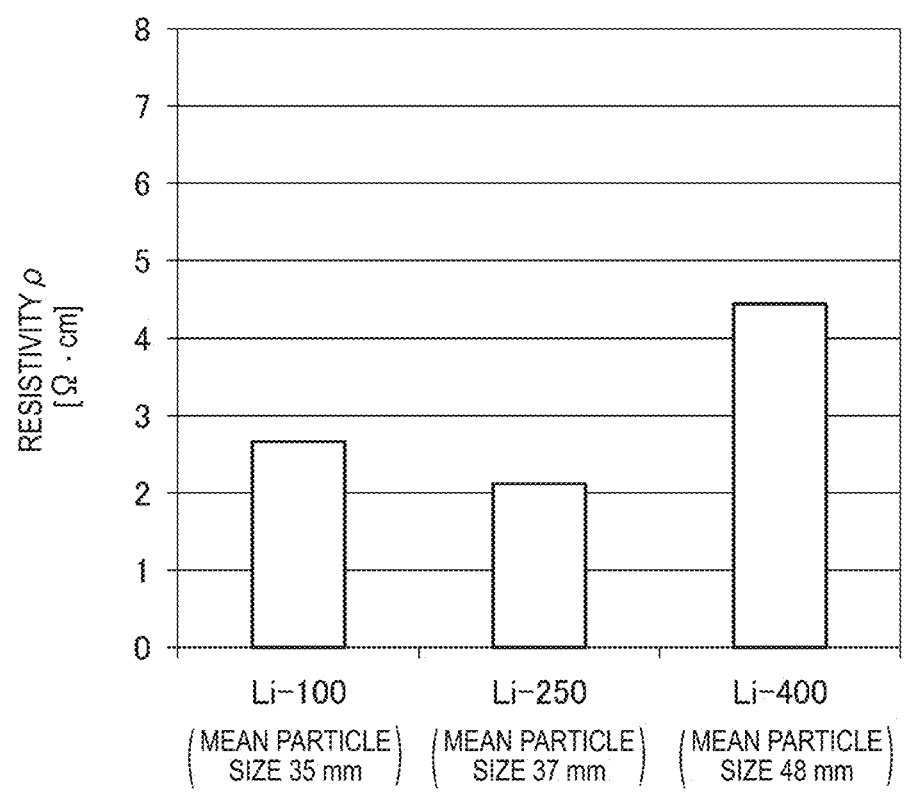
FIG. 24 is a graph showing the relationship between the type of nanocarbon used in Samples 7-1 to 7-3 and the resistivity.

FIG. 24 shows the relationship between the type of nanocarbon used in Samples 7-1 to 7-3 and the resistivity. FIG. 24 indicates that the electrode has excellent conductivity when the mean particle size of nanocarbon is 35 nm or more and 37 nm or less.

<Samples Having Different Amounts of Uniaxial Stretching and Different Amounts of Biaxial Stretching and Evaluated for Their Resistivity>

[Samples 8-1 to 8-4]

Figure 29A:
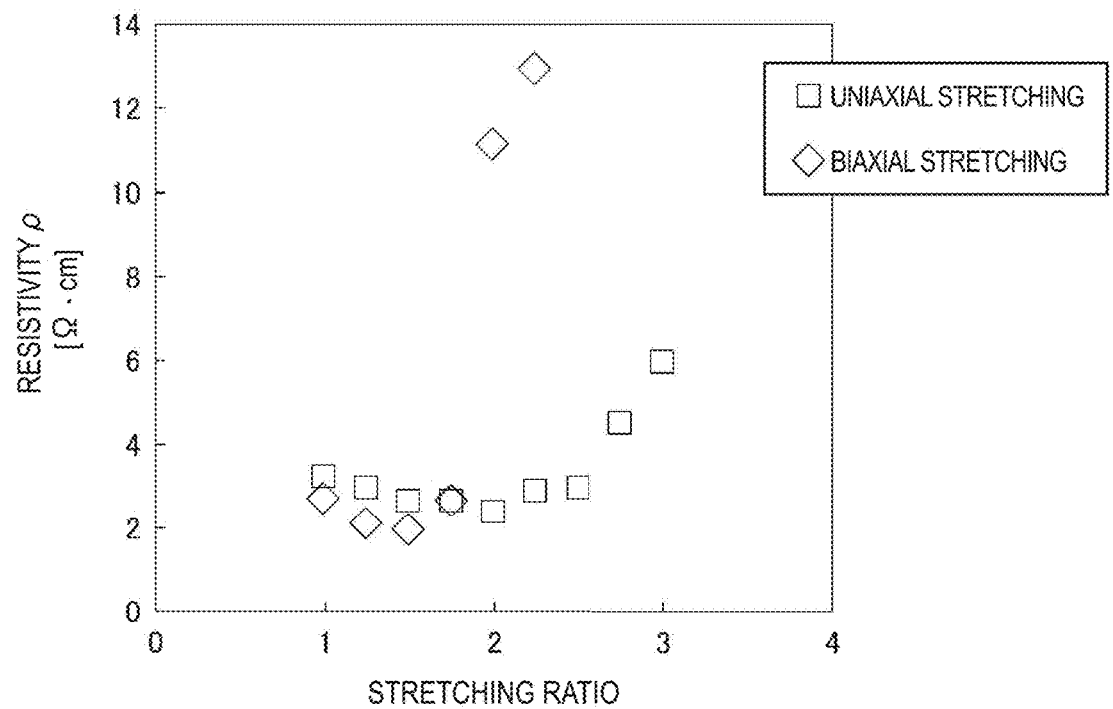
FIG. 29A is a graph showing the relationship between the stretching ratio and the resistivity.
Figure 29B:
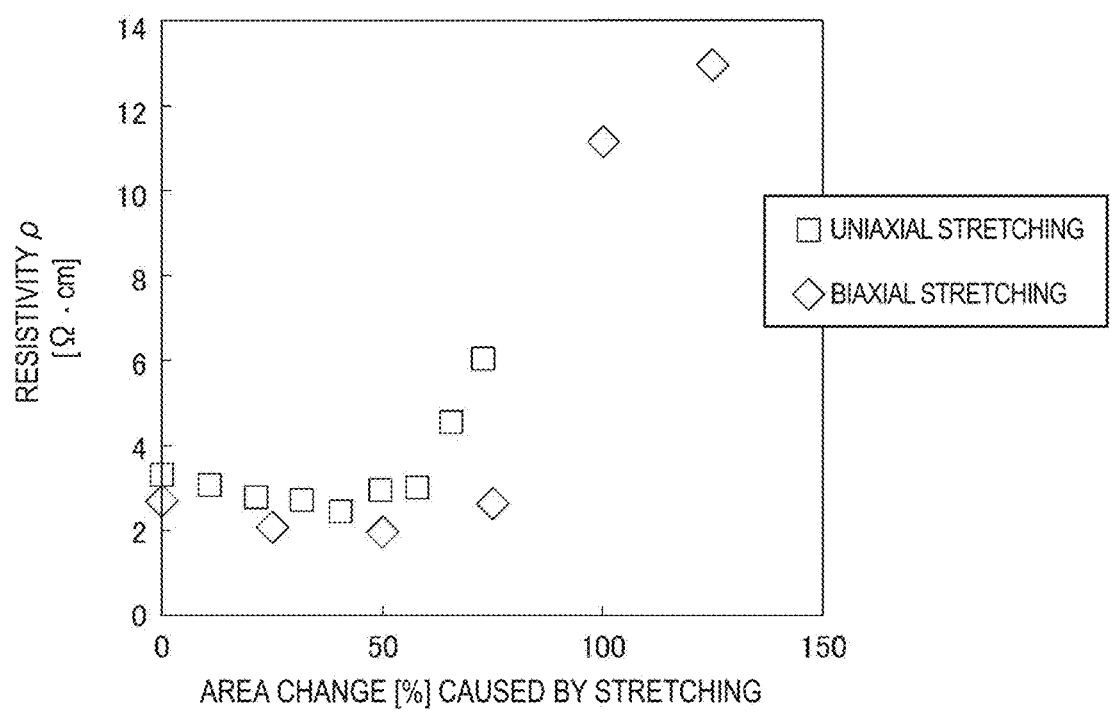
FIG. 29B is a graph showing the relationship between the area change caused by stretching and the resistivity.

Actuators were obtained in the same manner as that for Sample 7-1 except that, in the step of preparing the solution, the carbon filler solution and the elastomer solution were mixed such that the mass ratio (carbon filler:elastomer) of a FIG. 29A shows the relationship between the stretching ratio and the resistivity. FIG. 29B shows the relationship between the area change caused by stretching and the resistivity. FIGS. 29A and 29B indicate that the resistance change corresponding to stretching does not depend on the magnitude of stretching in one axial direction, but depends on the area change of the entire sheet.

<Actuator in which Elastomer Layer and Electrode are Stacked>

In Samples 9-1 to 9-3 and 10-1 to 10-3 described below, the parts corresponding to those in Sample 5-1 are denoted by the same characters.

[Samples 9-1 to 9-3]

Electrodes 611b and silicone elastomer sheets 611a having a thickness of 100 µm were alternately stacked on top of one another to form a stack. In addition, as shown in Table 4, the biaxial stretching ratio in the X-axis direction and the Y-axis direction was set to 1, 1.5, and 1.7. It is noted that, in stacking, the elastomer sheet 611a was sandwiched between the electrodes 611b, and the number of the elastomer sheets 611a was 10. Moreover, the electrodes 611b were produced so as to contain nanocarbon (available from Denka Company Limited, DENKA BLACK Li (Li-100)) and a silicone elastomer (available from Dow Corning Toray Co., Ltd., MS1003) at a mass ratio (nanocarbon: silicone elastomer) of 19:81. Actuators were obtained in the same manner as that for Sample 5-1 except for the above-described points.

[Samples 10-1 to 10-3]

Actuators were obtained in the same manner as that for Samples 9-1 to 9-3 except that the number of the elastomer sheets 611a was 1.

[Evaluation of Dielectric Breakdown Strength]

The dielectric breakdown strength of the actuators of Samples 9-1 to 9-3 and 10-1 to 10-3 obtained as described above was calculated in the same manner as that in the evaluation of the dielectric breakdown strength of Sample 5-1.

Table 4 shows the evaluation results of the actuators of Samples 9-1 to 9-3.

TABLE 4

|  | Number of stacked elastomer layers | Biaxial stretching ratio | Dielectric breakdown strength (MV/m) |
|---|---|---|---|
| Sample 9-1 | 10 | 1 | 71 |
| Sample 9-2 |  | 1.5 | 101 |
| Sample 9-3 |  | 1.7 | 132 |

Table 5 shows the evaluation results of the actuators of Samples 10-1 to 10-3.

TABLE 5

|  | Number of stacked elastomer layers | Biaxial stretching ratio | Dielectric breakdown strength (MV/m) |
|---|---|---|---|
| Sample 10-1 | 1 | 1 | 80 |
| Sample 10-2 |  | 1.5 | 110 |
| Sample 10-3 |  | 1.7 | 135 |

Figure 30A:
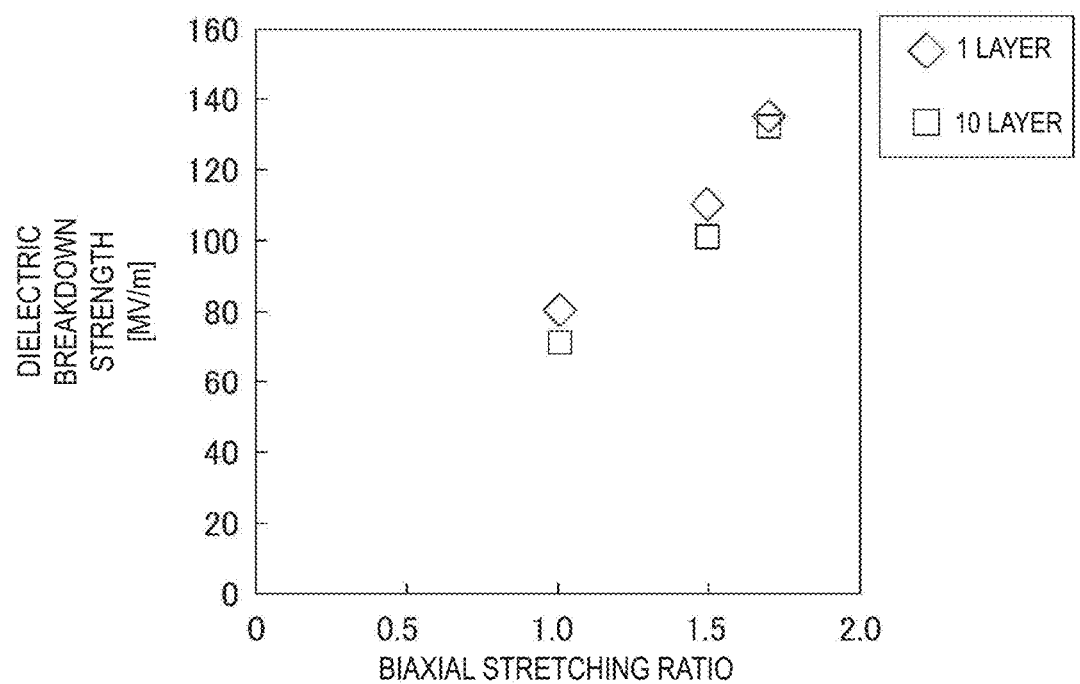
FIG. 30A is a graph showing the relationship between the biaxial stretching ratio and the dielectric breakdown strength.

FIG. 30A shows the relationship between the biaxial stretching ratio and the dielectric breakdown strength. FIG. 30A indicates that the dielectric breakdown strength of the actuators including 10 stacked elastomer sheets 611a increases with increasing amount of stretching like the dielectric breakdown strength of the actuators including a single elastomer sheet 611a.

[Evaluation of Area Change]

The area change of Samples 9-2 and 9-3 (stretched samples including 10 stacked elastomer sheets 611a) upon application of a 100 MV/m electric field was obtained.

Table 6 shows the evaluation results of the actuators of Samples 9-2 and 9-3.

TABLE 6

|  | Number of stacked elastomer layers | Biaxial stretching ratio | Area Change (%) |
|---|---|---|---|
| Sample 9-2 | 10 | 1.5 | 13.4 |
| Sample 9-3 |  | 1.7 | 18.9 |

Figure 30B:
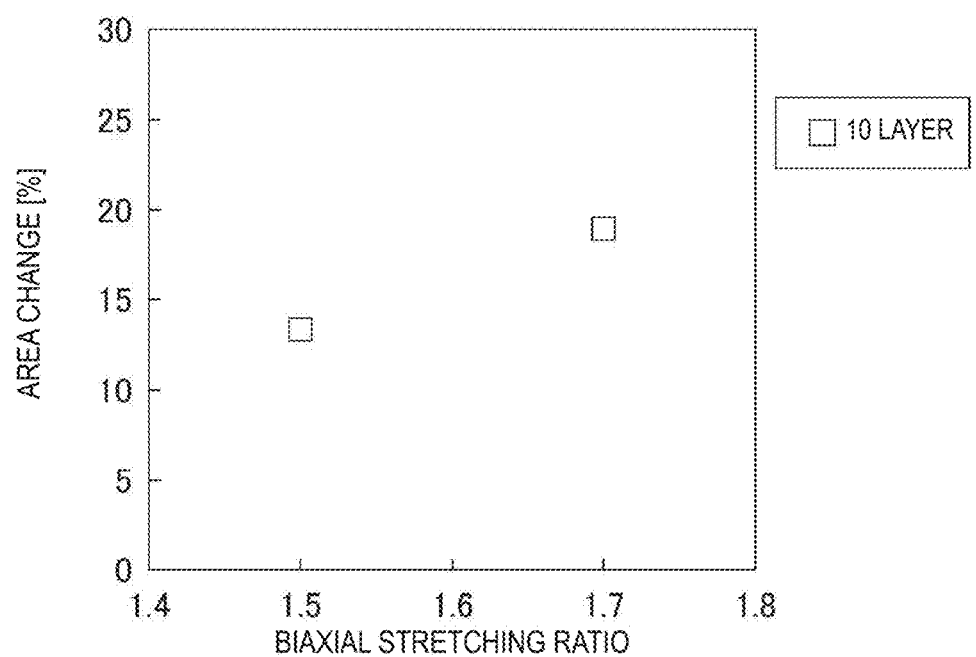
FIG. 30B is a graph showing the relationship between the biaxial stretching ratio and the area change.

FIG. 30B shows the relationship between the biaxial stretching ratio and the area change. FIG. 30B indicates that the stretched actuators including 10 stacked elastomer sheets 611a can achieve an area change as large as 10% or more.

The embodiments and examples of the present technology have been specifically described above. However, the present technology is not limited to the above-described embodiments and examples. Various modifications of the present technology can be made without departing from the technical spirit of the present technology.

For example, the configurations, the methods, the processes, the shapes, the materials, the numerical values, and the like mentioned in the above-described embodiments and examples are merely examples. Different configurations, methods, processes, shapes, materials, numerical values, and the like may be used, as necessary.

Further, configuration, methods, processes, shapes, materials, numerical values and the like in the above-described embodiments and examples may be combined insofar as they are not departing from the spirit of the present technology.

Additionally, the present technology may also be configured as below.

(1)

An actuator including:

a stack including:

an elastomer layer; and an elastic electrode disposed on each surface of the elastomer layer, in which the stack is subjected to a pre-strain of 50% or more at least in one direction.

(2)

The actuator according to (1), in which the elastomer layer has a Young's modulus of 10 MPa or less, and the elastomer layer has a strain at break of 200% or more.

(3)

The actuator according to (1) or (2), in which the electrodes in a pre-strain-released state have a mean thickness of 500 µm or less, and the electrodes with the stack subjected to a strain of 100% or more have a volume resistivity of 10 MΩ·cm or less.

(4)

The actuator according to any of (1) to (3), in which the electrode contains at least one of a conductive filler or a conductive polymer.

(5)

The actuator according to (4), in which the electrode further contains an elastomer.

(6)

The actuator according to (4) or (5), in which the conductive filler contains at least one of a carbon-based filler, a metal-based filler, a metal oxide-based filler, or a metal-coated filler.

(7)

The actuator according to any of (1) to (3), in which the electrode contains a conductive filler, and the conductive filler is carried on a surface of the elastomer layer.

(8)

The actuator according to any of (1) to (7), in which the electrode is solid, gel, or liquid.

(9)

The actuator according to any of (1) to (3), in which the electrode contains an elastic ion-conductive material and an electrolyte.

(10)

The actuator according to any of (1) to (3), in which the electrode contains a suspension and at least one of a conductive filler or a conductive polymer.

(11)

The actuator according to any of (1) to (10), in which the electrodes and the elastomer layer are stacked alternately and repeatedly.

(12)

The actuator according to any of (1) to (11), in which part of the electrode has a Young's modulus exceeding 10 MPa.

(13)

The actuator according to any of (1) to (12), in which an interface between the elastomer layer and the electrode undergoes an adhesion improving treatment.

(14)

The actuator according to any of (1) to (13), further including a holding unit that holds the stack, in which the holding unit is capable of changing the stack in size.

(15)

The actuator according to any of (1) to (13), further including a holding unit that holds the stack in a pre-strained state.

(16)

The actuator according to any of (1) to (15), in which the stack is subjected to a pre-strain of 50% or more in a direction orthogonal to a driving direction, and the pre-strain in the direction orthogonal to the driving direction is larger than a pre-strain in the driving direction.

(17)

The actuator according to any of (1) to (15), in which the stack is subjected to a pre-strain of 50% or more in a direction orthogonal to a driving direction and no pre-strain in the driving direction.

(18)

The actuator according to any of (1) to (17), in which the electrode contains a carbon-based filler and silicone.

(19)

The actuator according to any of (1) to (18), in which the stack has a round tubular shape or a fiber shape.

(20)

An actuator including:

a stack including:

an elastomer layer; and an elastic electrode disposed on each surface of the elastomer layer, wherein the stack is subjected to a pre-strain at least in one direction, and the elastomer layer has a mean thickness of 3 µm or less.

(21)

A method for manufacturing an actuator, the method including:

alternately stacking an electrode and an elastomer layer to form a stack; and stretching the formed stack at least in one direction.

(22)

The method for manufacturing an actuator according to (21), in which the forming of the stack includes:

alternately stacking the electrode and the elastomer layer on a substrate to form a layered product; and peeling the formed layered product partially or entirely from the substrate to form the stack.

(23)

The method for manufacturing an actuator according to (21) or (22), in which the electrode is formed by applying and drying a coating material containing a conductive material, and the elastomer layer is formed by applying and drying a coating material containing an elastomer.

(24)

The method for manufacturing an actuator according to (21) or (22), in which the electrode is formed by applying and drying a coating material containing a carbon-based filler, silicone, and a non-polar solvent.

REFERENCE SIGNS LIST

10, 20, 30, 40, 111, 210, 312 actuator
11, 21, 31 stack
11*a*, 21*a* electrode
11*b*, 21*b* elastomer layer
12, 112, 212 holding unit
22 coil spring
23, 24 sealing unit
32, 33 electrode sheet
32*a*, 33*a* elastomer layer
32*b*, 33*b* electrode
40G$_1$ first actuator group
40G$_2$ second actuator group
41 roll
42A, 42B terminal
110 speaker
212*a* shaft
212*b*, 212*c* holding member
310 endoscope
311 operation section
313 distal end section
321 controller
322 bending drive circuit
323 power source
411, 421 actuator array
412 voltage source
413A, 413B wire
414 support
510 joint driving device
511 columnar member
512A, 512B actuator
513 support
514 rotary member
515 drive shaft
516 linear member
611*a*, 621*a*, 622 elastomer sheet
611*b*, 621*b* electrode
612 fixing jig
623 biaxial stretching jig
624 four-terminal probe

The invention claimed is:

1. An actuator comprising:
   a stack including:
   an elastomer layer; and
   an elastic electrode disposed on each surface of the elastomer layer, wherein the stack is subjected to a pre-strain of 50% or more at least in one direction, and wherein the stack has a round tubular shape with the elastic electrodes disposed on opposite surfaces of the elastomer layer in a radial direction of the stack.

2. The actuator according to claim 1, wherein
the elastomer layer has a Young's modulus of 10 MPa or less, and
the elastomer layer has a strain at break of 200% or more.

3. The actuator according to claim 1, wherein
each elastic electrode in a pre-strain-released state has a mean thickness of 500 μm or less, and
each elastic electrode with the stack subjected to a strain of 100% or more has a volume resistivity of 10 Ω·cm or less.

4. The actuator according to claim 1, wherein each elastic electrode contains at least one of a conductive filler or a conductive polymer.

5. The actuator according to claim 4, wherein each elastic electrode further contains an elastomer.

6. The actuator according to claim 4, wherein the conductive filler contains at least one of a carbon-based filler, a metal-based filler, a metal oxide-based filler, or a metal-coated filler.

7. The actuator according to claim 1, wherein
each elastic electrode contains a conductive filler, and
the conductive filler is carried on a surface of the elastomer layer.

8. The actuator according to claim 1, wherein each elastic electrode is solid, gel, or liquid.

9. The actuator according to claim 1, wherein each elastic electrode contains an elastic ion-conductive material and an electrolyte.

10. The actuator according to claim 1, wherein each elastic electrode contains a polymer suspension and at least one of a conductive filler or a conductive polymer.

11. The actuator according to claim 1, wherein each elastic electrode and the elastomer layer are stacked alternately and repeatedly.

12. The actuator according to claim 1, wherein part of each elastic electrode has a Young's modulus exceeding 10 MPa.

13. The actuator according to claim 1, wherein an interface between the elastomer layer and each elastic electrode undergoes an adhesion improving treatment.

14. The actuator according to claim 1, further comprising a holding unit that holds the stack,
wherein the holding unit is capable of changing the stack in size.

15. The actuator according to claim 1, further comprising a holding unit that holds the stack in a pre-strained state.

16. The actuator according to claim 1, wherein
the stack is subjected to a pre-strain of 50% or more in a direction orthogonal to a driving direction, and
the pre-strain in the direction orthogonal to the driving direction is larger than a pre-strain in the driving direction.

17. The actuator according to claim 1, wherein
the stack is subjected to a pre-strain of 50% or more in a direction orthogonal to a driving direction and no pre-strain in the driving direction.

18. The actuator according to claim 1, wherein each elastic electrode contains a carbon-based filler and silicone.

19. An actuator comprising:
a stack including:
an elastomer layer; and
an elastic electrode disposed on each surface of the elastomer layer,
wherein the stack is subjected to a pre-strain at least in one direction, and
the elastomer layer has a mean thickness of 3 μm or less, and wherein the stack has a round tubular shape with the elastic electrodes disposed on opposite surfaces of the elastomer layer in a radial direction of the stack.

* * * * *